(12) United States Patent
Kerzman et al.

(10) Patent No.: US 6,889,370 B1
(45) Date of Patent: May 3, 2005

(54) METHOD AND APPARATUS FOR SELECTING AND ALIGNING CELLS USING A PLACEMENT TOOL

(75) Inventors: Joseph Peter Kerzman, New Brighton, MN (US); James Edward Rezek, Mounds View, MN (US)

(73) Assignee: Unisys Corporation, Blue Bell, PA (US)

( * ) Notice: Subject to any disclaimer, the term of this patent is extended or adjusted under 35 U.S.C. 154(b) by 736 days.

(21) Appl. No.: 09/597,529

(22) Filed: Jun. 20, 2000

(51) Int. Cl.[7] .............................................. G06F 9/45
(52) U.S. Cl. ................. 716/8; 716/1; 716/9; 716/10; 716/11
(58) Field of Search ........................ 716/1, 2, 4, 5, 716/6, 7, 8, 9, 10, 11, 12, 13, 14, 16, 17–18; 703/15; 430/15, 5; 365/230.05; 326/41; 257/35, 635; 715/507; 714/727

(56) References Cited

U.S. PATENT DOCUMENTS

| | | | |
|---|---|---|---|
| 4,758,953 A | 7/1988 | Morita et al. ............... 364/300 |
| 4,831,543 A | 5/1989 | Mastellone ................ 364/489 |
| 4,918,614 A | 4/1990 | Modarres et al. .......... 364/490 |
| 5,050,091 A | 9/1991 | Rubin ....................... 364/488 |
| 5,155,836 A | 10/1992 | Jordan et al. .............. 395/500 |
| 5,164,908 A | 11/1992 | Igarashi .................... 364/491 |
| 5,175,696 A | 12/1992 | Hooper et al. ............. 364/489 |
| 5,222,029 A | 6/1993 | Hooper et al. ............. 364/489 |
| 5,255,363 A | 10/1993 | Seyler ....................... 395/164 |
| 5,267,175 A | 11/1993 | Hooper ...................... 364/489 |
| 5,341,309 A | 8/1994 | Kawata ...................... 364/489 |
| 5,349,659 A | 9/1994 | Do et al. .................... 395/700 |
| 5,355,317 A | 10/1994 | Talbott et al. .............. 384/468 |
| 5,357,440 A | 10/1994 | Talbott et al. .............. 364/467 |
| 5,359,523 A | 10/1994 | Talbott et al. .............. 364/468 |
| 5,359,537 A | 10/1994 | Saucier et al. ............. 364/489 |
| 5,361,357 A | 11/1994 | Kionka ....................... 395/700 |
| 5,398,195 A | 3/1995 | Kim ........................... 364/491 |
| 5,406,497 A | 4/1995 | Altheimer et al. .......... 364/489 |
| 5,416,721 A | 5/1995 | Nishiyama et al. ......... 364/491 |
| 5,418,733 A | 5/1995 | Kamijima .................. 364/490 |
| 5,418,954 A | 5/1995 | Petrus ........................ 395/700 |
| 5,440,720 A | 8/1995 | Baisuck et al. ............. 395/500 |
| 5,461,576 A | * 10/1995 | Tsay et al. ..................... 716/6 |
| 5,483,461 A | 1/1996 | Lee et al. ................... 364/490 |
| 5,485,396 A | 1/1996 | Brasen et al. .............. 364/491 |
| 5,490,266 A | 2/1996 | Sturges ....................... 395/500 |
| 5,490,268 A | 2/1996 | Matsunaga ................. 395/550 |
| 5,491,640 A | 2/1996 | Sharma et al. ............. 364/488 |
| 5,493,508 A | 2/1996 | Dangelo et al. ............ 364/489 |
| 5,515,293 A | 5/1996 | Edwards ..................... 364/489 |
| 5,521,836 A | 5/1996 | Hartoog et al. ............. 364/491 |
| 5,663,893 A | 9/1997 | Wampler et al. ............ 364/491 |
| 5,689,433 A | 11/1997 | Edwards ..................... 364/490 |
| 5,696,693 A | * 12/1997 | Aubel et al. ................... 716/8 |

(Continued)

OTHER PUBLICATIONS

Unisys Corporation, "VIM Plan Version 4R13 For Dummies", dated prior to Jun. 20, 2000, 63 pages.
http://www.arcadiadesign.com/mustang.htm, Feb. 29, 2000, 7 pages.

*Primary Examiner*—Vuthe Siek
*Assistant Examiner*—Helen Rossoshek
(74) *Attorney, Agent, or Firm*—Charles A. Johnson; Mark T. Starr; Crompton, Seager, Tufte, LLC

(57) ABSTRACT

Methods and apparatus for efficiently identifying, selecting and aligning cells within a circuit design are disclosed. Preferably, a net or group-of nets is first identified by the circuit designer. Then, selected cells that are connected to the selected net or group of nets are identified by the placement tool. A qualification or filter may be provided for filtering which cells are selected. For example, the filter may allow only those cells that are source cells, destination cells, placed cells, unplaced cells, etc., or any combination thereof to be selected. The selected cells may be aligned in a direction of an alignment axis, if desired.

35 Claims, 19 Drawing Sheets

U.S. PATENT DOCUMENTS

| | | | |
|---|---|---|---|
| 5,706,295 A | 1/1998 | Suzuki | 371/22.1 |
| 5,712,794 A | 1/1998 | Hong | 364/491 |
| 5,838,583 A * | 11/1998 | Varadarajan et al. | 716/9 |
| 6,449,761 B1 * | 9/2002 | Greidinger et al. | 716/11 |
| 6,496,965 B1 * | 12/2002 | van Ginneken et al. | 716/10 |
| 6,516,456 B1 * | 2/2003 | Garnett et al. | 716/8 |
| 6,539,533 B1 * | 3/2003 | Brown et al. | 716/17 |

\* cited by examiner

SELECT SOURCES FOR NET A(0-7)

ABUT VECTOR, BIT ZEROS IN LEFT COLUMN

| Cell A(0) | Cell A(1) | Cell A(2) | Cell A(3) | Cell A(4) | Cell A(5) | Cell A(6) | Cell A(7) |
|---|---|---|---|---|---|---|---|
| 404 | 408 | 410 | 412 | 420 | 424 | 430 | 440 |

510

ABUT VECTOR, BIT ZEROS IN RIGHT COLUMN

| Cell A(7) | Cell A(6) | Cell A(5) | Cell A(4) | Cell A(3) | Cell A(2) | Cell A(1) | Cell A(0) |
|---|---|---|---|---|---|---|---|
| 440 | 430 | 424 | 420 | 412 | 410 | 408 | 404 |

METHOD AND APPARATUS FOR SELECTING AND ALIGNING CELLS USING A PLACEMENT TOOL

CROSS REFERENCE TO CO-PENDING APPLICATIONS

The present application is related to U.S. patent application Ser. No. 09/597,978, filed Jun. 20, 2000, entitled "Method And Apparatus For Traversing And Placing Cells In A Placement Tool", and U.S. patent application Ser. No. 08,7898,026, filed Jan. 27, 1997, entitled "Method And Apparatus For Selecting Components Within A Circuit Design Database", both of which are assigned to the assignee of the present invention and both of which are incorporated herein by reference.

TECHNICAL FIELD OF THE INVENTION

This invention relates generally to computer-aided design (CAD) techniques for placement of logic functions and cells on an integrated circuit chip during the chip design process. The invention more specifically relates to a method and apparatus, typically embodied in a CAD system, for selecting and aligning cells on an application specific integrated circuit (ASIC).

BACKGROUND OF THE INVENTION

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer and output devices, such as computer displays, being used to provide visual feedback of the design to the designer as it is being constructed. Specifically, the design entry operation involves generating a description of the logic design to be implemented on the circuit chip in an appropriate machine-readable form.

Chip designers generally employ hierarchical design techniques to determine the appropriate selection and interconnection of logic and/or memory devices that will enable the chip to perform the desired function. These techniques involve describing the chip's functionality at various levels of abstraction, ranging from the most general function performed by the chip to the precise functions performed by each logic and/or memory element on the chip.

The hierarchy of a logic design typically has "N" levels of functions, where N is an integer ($N \geq 1$) representing the number of hierarchical levels of functionality in the chip. The first level is typically the chip itself. Each of the lower levels of hierarchy, such as when "N" is an integer ($1 \leq n \leq N$), represent the level of any particular function in the hierarchy. A function consists of a discrete logic and/or memory element, or any combination of such elements. It may be as simple as an inverter or a flip-flop, having one or only a few transistors, or as complex as a shift register, an arithmetic logic unit (ALU), or even a microprocessor.

A parent function at the (N) level of the hierarchy is defined as a plurality of (N+1) level functions, each of which is a child function. For example, a microprocessor at the (N) level might be defined as the parent of the following (N+1) level children: an ALU, a series of registers, a bus, and various other functions (each of which may or may not have a plurality of (N+2) level children, and so on). Each child function which is not also a parent function (i.e., which has no children) is referred to as a leaf function or cell. Each leaf cell in a design is connected to at least one other leaf cell, such connection being commonly referred to as a "net." The set of nets, each of which often defines a plurality of interconnected functions, is commonly referred to as a "netlist."

It is useful to distinguish between those cells provided by the chip vendor as primitive cells (i.e., leaf candidates) and the user-defined hierarchy blocks built upon them. One way is to speak of a "cell library" vs. a "design library" as two separate libraries, both of which are available to subsequent designs. Alternatively, at least initially, a design library contains a standard cell library. A cell library is a database containing detailed specifications on the characteristics of each logical component available for use in a design.

The initial cell library is usually provided by a chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a particular 2NAND component is specified as part of a given circuit design, it is given an instance name, to distinguish it from all other 2NAND gates used in the circuit. The instance name typically includes the instance names of all parent instances by concatenation when defining the instance in the context of the chip. A single name is sufficient when dealing only in the context of a single user function.

The user-defined blocks can then be used to design larger blocks of greater complexity. The user-defined blocks are typically added to the design library, which grows from the additions of new design modules as the design evolves. The top level of the design hierarchy is often a single block that defines the entire design, and the bottom layer of the hierarchy typically includes leaf cells, the cells (i.e., the logical components) that were originally provided in the cell library.

Two common methods for specifying the design are schematic capture and hardware description languages. The schematic capture method provides a sophisticated user interface that allows a logic circuit to be drawn in graphical form on a computer display. Typically, the design is drawn using symbols from the cell and design libraries.

Encoding the design in a hardware description language (HDL) is a more common design entry technique for specifying modern integrated circuits. Hardware description languages are specifically developed to aid designers in describing a circuit. These languages often contain specific functions and syntax to allow complex hardware structures to be described in a compact and efficient way. Often, the circuit is specified at the register transfer level (also known as a "behavior level"). The register transfer level description is often specified in terms of relatively small building blocks, the names of which are specified by the circuit designer.

For designs using HDL entry, the generation of a detailed description (or gate-level description) is often accomplished using logic design synthesis software. Logic design synthesis software generates a gate-level description of user-defined input and output logic, and also creates new gate-level logic to implement user-defined logical functions. Constituent parts of new gate-level logic created during each pass through the logic design synthesis software are typically given computer-generated component and net names. Each time the logic design synthesis software is executed, the component and net names that are generated by the software, and not explicitly defined by the user, may change, depending on whether new logic has been added to or deleted from the integrated circuit design. Typically, the logic design synthesis software is executed many times during the integrated circuit design process, because errors are detected during the simulation and testing phases of the design cycle and then fixed in the behavioral description.

In some design processes, the output of the logic design synthesis software is optimized by a logic optimizer tool typically implemented in software. The logic optimizer tool can often create more efficient logic in terms of space, power or timing, and may remove logic from the design that is unnecessary. This action also typically affects the component and net names generated by the logic synthesis tool.

The output of the logic optimizer tool is an optimized detailed description that completely specifies the logical and functional relationships among the components of the design. Once the design has been converted to this form, it is necessary to verify that the logic definition is correct and that the circuit implements the function expected by the designer. If errors are detected or the resulting functionality or timing is unacceptable, the designer modifies the design as needed. As a result of each revision to the design, the logic design synthesis-generated component and net names may again change. These design iterations, however, help ensure that the design satisfies the desired requirements.

After timing verification and functional simulation has been completed on the design, placement and routing of the design's components is performed. These steps involve assigning components of the design to locations on the integrated circuit chip and interconnecting the components to form nets. This may be accomplished using automated and/or manual place and route tools.

Because automatic placement tools may not yield an optimal design solution, particularly for high performance designs that have strict timing and physical requirements, circuit designers often manually place critical circuit objects (e.g., functions or cells) within the boundary of the integrated circuit. This may be accomplished by using a commercially available placement directive tool (also known as a placement or floorplanning tools) typically implemented in software. The placement tool may include a graphics terminal that provides the circuit designer with visual information pertaining to the circuit design. This information is typically contained in several different windows.

A floorplanning window may display a graphical representation of, for example, the die area of an integrated circuit, the placed objects and connectivity information. Similarly, a placed physical window may display the alphanumeric names of all placed cells and hierarchical functions. An un-placed physical window may display the alphanumeric names of all un-placed cells and hierarchical functions. A logic window may display a hierarchical tree graph of the circuit design.

During the placement process, the circuit designer may select the name of a desired object from the un-placed physical window displaying the un-placed objects. After this selection, the placement tool retrieves the physical representation of the selected object, and the circuit designer uses the cursor to position the physical representation of the selected object within the floorplanning window. The placement tool may then move the alphanumeric name of the selected object from the un-placed physical window to the placed physical window to indicate the placement thereof.

To edit the placement of desired objects, the circuit designer typically selects the desired object from within the floorplanning window using a pointing device. For example, the circuit designer may draw a rectangle around the desired objects to affect the selection. After selection, the circuit designer may instruct the placement tool to perform a desired editing function on the selected objects.

Some placement tools allow the circuit designer to select a desired level of hierarchy or region as the current working environment, or "context". When the context is set, all of the objects existing at the next lower level in the circuit design hierarchy are displayed in one of the physical windows, thus making them available for placement or editing. These objects are called children objects of the selected context, and may include other hierarchical objects, including regions and/or cells. Thus, a context may include a mixture of regions and cells.

In this environment, a circuit designer may perform preliminary placement by first placing high level regions. In some placement tools, the outer boundaries of the regions are appropriately sized to accommodate all underlying objects, even though all of the objects may not yet be placed. Thus, the circuit designer may rely on an automated placement tool to subsequently position the underlying objects within the boundary of the region. If more detailed placement is required because of timing, physical or other constraints, selected lower level regions or cells may be manually placed by the circuit designer.

After placement is complete, the routing step must be performed. As mentioned above, a net is a set of points that are to be electrically equivalent by connection. The purpose of routing is to connect points in each net of the logic design so that the connections required within nets are complete. The position of the points in any particular net are decided by the placement process, although there may be sets of points that are already connected together, thereby introducing choices as to where a connection has to be made to complete a net.

Global routing aims to decide exactly which points in each net will be connected together and the approximate path that each connection will take. Fine routing involves determining the final paths of all connections needed to complete the design. Automatic routing by routing tools often requires a large amount of computational effort. The routing problem can be significantly reduced in complexity if a near-optimal placement of the cells has been achieved. It is during this final stage of the physical design of the circuit that the inability to complete the design on a particular sized chip and architecture is detected. This layout failure may have been caused by an unsatisfactory placement. Often, the failure to complete the design is only apparent when the final few percent of the connections are being added. Hence, it is critical that an excellent placement of the cells is generated during the placement process.

In recent years, data paths have become a greater part of many modern chip designs, often consuming over 80 percent of the total circuitry on the chip. Ideally, a placed data path includes a collection of vertical and horizontal wires with logic elements located at the intersections that combine to perform an overall data processing function. While some placement tools attempt to automate part of all of the placement of data path structures, circuit designers can often provide a better solution by manually placing at least some of the cells.

To manually place cells within a data path, it is often desirable to select those cells that are connected to a net or group of nets. For example, it would be desirable to select those cells that are connected to a vectored net, such as a vectored net that crosses the interface of a logic function. The vectored net may correspond to the output or an intermediate net within the data path. Once selected, the cells that are connected to the net may be aligned to form an optimum data path stage.

To date, selecting cells that are connected to a net or group of nets has been difficult. For example, to select cells that are connected to a particular net, the circuit designer typically must manually find each instance name by scanning some external printout, panning through a list of instance names or net names in the physical window, or by identifying the physical representation of the cell within the floorplanning window. Each of these have proven to be time consuming and tedious, particularly since many logic design synthesis software programs assign computer generated component and net names.

As a result of these difficulties, circuit designers often only have time to manually place a fraction of the cells within a data path. The remaining cells are placed using automatic placement tools, which typically use algorithms that optimize wire congestion rather than performance or gate density. Accordingly, any improvement in the manual placement process that can significantly reduce the time required to identify, select and align cells associated with a net or group of nets within a circuit design would be beneficial.

SUMMARY OF THE INVENTION

The present invention provides methods and apparatus for efficiently identifying, selecting and aligning cells that are associated with a net or group of nets within a circuit design. In one illustrative embodiment, a particular net or group of nets is first selected. Then, selected leaf cells that are connected to the selected net or group of nets are automatically identified and selected. This is preferably accomplished by scanning the netlist of the circuit design database, and identifying those cells that are connected to the selected net or group of nets. If desired, the selected leaf cells may then be aligned in a direction of a predetermined alignment axis. This method allows a circuit designer to easily identify, select and align those cells that are connected to a selected net or group of nets within the circuit design. This may be particularly useful when manually placing data paths within a circuit design to improve the performance and density of the placement solution.

To provide added flexibility, a qualification or filter may be provided when selecting the leaf cells that are connected to the selected net or group of nets. In one illustrative embodiment, all of the leaf cells that are connected to the selected net or group of nets are identified and selected. In another illustrative embodiment, only those leaf cells that have an output connected to the selected net or group of nets (source leaf cells) are identified and selected. In yet another illustrative embodiment, only those leaf cells that have an input connected to the selected net or group of nets (destination leaf cells) are identified and selected.

It is contemplated that the qualification or filter may also distinguish between placed and unplaced cells. For example, only those placed leaf cells that are connected to the selected net or group of nets may be identified and selected. In another example, only those unplaced leaf cells that have input connected to the selected net or group of nets (unplaced destination leaf cells) may be identified and selected.

It is also contemplated that a context may be set, which identifies the logic functions and/or leaf cells at a selected level of hierarchy in the circuit design. When a context is set, it is contemplated that the qualification or filter may distinguish between leaf cells that are inside and leaf cells that are outside the current context. For example, the qualification or filter may be used to select only those leaf cells that are in the current context and are connected to the selected net or group of nets. In another example, the qualification or filter may be used to select only those leaf cells that are in the current context, are placed, and have an input that is connected to the selected net or group of nets (destination leaf cells). These various attributes of the qualification or filter may be used in any combination to provide the circuit designer with great flexibility in identifying and selecting leaf cells within the circuit design.

Often, the net names at the interface of each logic function (non-leaf cell) retain a descriptive value, even after the logic synthesis and logic optimization steps. Accordingly, it is often convenient to identify nets at the interface of a logic function and trace the nets backward (or forward) to identify the source leaf cells, the destination leaf cells or both. This provides the circuit designer with a convenient way to trace through a circuit design, is such as through a data path of a circuit design.

Using this technique, a circuit designer may identify a vectored net at the interface of a logic function. Once the vectored net is identified and selected, the circuit designer may choose to direct the placement tool to select all source leaf cells associated with the vectored net, as described above. That is, the circuit designer may direct the placement tool to select all leaf cells that drive the vectored net. Some of these leaf cells may be placed, and others may be unplaced. In a preferred embodiment, the unplaced leaf cells are placed when selected.

The circuit designer may then direct the placement tool to align all of the selected leaf cells in a direction of an alignment axis. In a preferred embodiment, the alignment axis is specified by the circuit designer, and is commonly either substantially horizontal or substantially vertical. In the case of a vectored net, the circuit designer may also specify a predetermined order for the leaf cells. For example, the circuit designer may specify that the source leaf cells should be placed along a substantially horizontal alignment axis with bit zero on the left and bit "N" on the right. Alternatively, the circuit designer may specify that the source leaf cells should be placed along a substantially horizontal alignment axis with bit zero on the right and bit "N" on the left. In another case, the circuit designer may specify that the source leaf cells should be placed along a substantially vertical alignment axis with bit zero on the top and bit "N" on the bottom. Alternatively, the circuit designer may specify that the source leaf cells should be placed along a substantially vertical alignment axis with bit zero on the bottom and bit "N" on the top. In any of these cases, the source leaf cells are aligned in the direction of an alignment axis, with the order of the leaf cells following a particular directive.

When more than just the source leaf cells are selected, such as when both the source and destination leaf cells are selected, the selected leaf cells may be arranged into an array configuration. Each of the identified leaf cells is associated with one of the ordered bits of the vectored net. As such, the source leaf cells may be aligned in the direction of an alignment axis and in a particular order, as discussed above. The destination leaf cells may then be placed adjacent the corresponding source leaf cell along an axis that is perpendicular to the alignment axis, thereby resulting in an array of leaf cells. It is recognized that the various nets of the vectored net may have a different number of destination leaf cells connected thereto, and thus may have a different number of destination leaf cells lined up adjacent to the corresponding source leaf cell. All of various features and mechanisms may be used alone or in combination to provide a circuit designer with an efficient way to identify, select and align cells within a circuit design.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 19 is a diagram demonstrating the "select sources" menu option, followed by the "abut vector with zeros in the left column" menu option and the "abut vector with zeros in the right column" menu option.

DETAILED DESCRIPTION OF THE INVENTION

Figure 1:
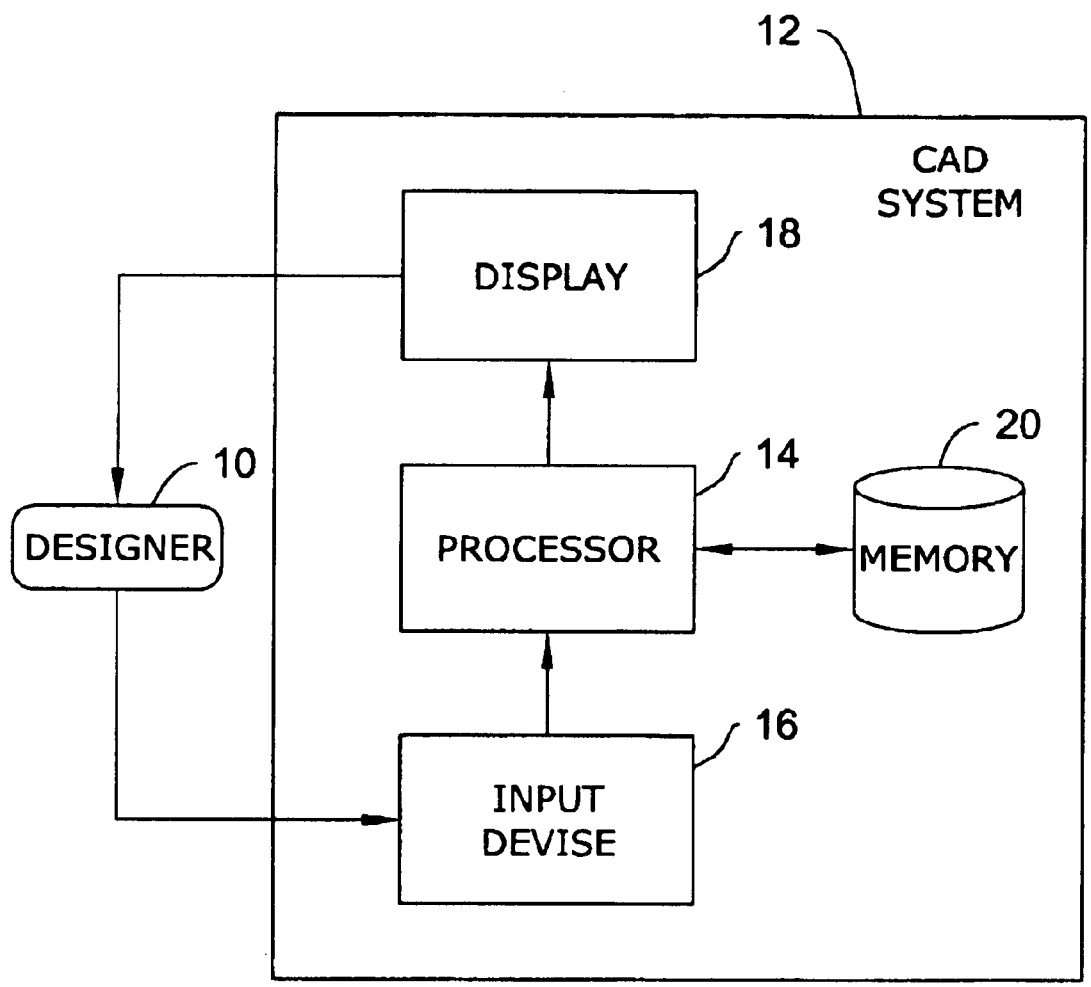
FIG. 1 is a block diagram of the computer-based environment of the present invention.

The detailed description which follows is presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to an apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer code expression executing on a computer. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with a CAD System 12 to enter a circuit design, validate the design, place the design's components on a chip, and route the interconnections among the components. The CAD System 12 includes a Processor 14, which executes operating system software as well as application programs known as CAD software. The Processor is found in all general purpose computers and almost all special purpose computers. The CAD System 12 is intended to be representative of a category of data processors suitable for supporting CAD operations. In one illustrative embodiment, the CAD System is a HP A1097C Series 700 engineering workstation, commercially available from Hewlett-Packard Corporation, although other engineering workstations or computer systems from manufacturers such as Sun Microsystems, Inc., may also be used.

The Designer 10 enters design information into the CAD System by using a well-known Input Device 16 such as a mouse, a keyboard, or a combination of the two devices. It should be understood, however, that the Input Device may actually be a card reader, magnetic or paper tape reader, or other well-known input device (including another computer system). A mouse or other cursor control device is typically used as an Input Device as a convenient means to input information to the CAD System to select command modes, edit input data, and the like.

Visual feedback of the design process is given to the Designer by showing the design being constructed as graphical symbols on Display 18. The Display is used to display messages and symbols to the Designer. Such a Display 18 may take the form of any of several well-known varieties of CRT displays. The CAD software being executed by the Processor 14 stores information relating to the logic design in Memory 20. The Memory may take the form of a semiconductor memory, magnetic disks, optical disks, magnetic tape or other mass storage device.

Figure 2:
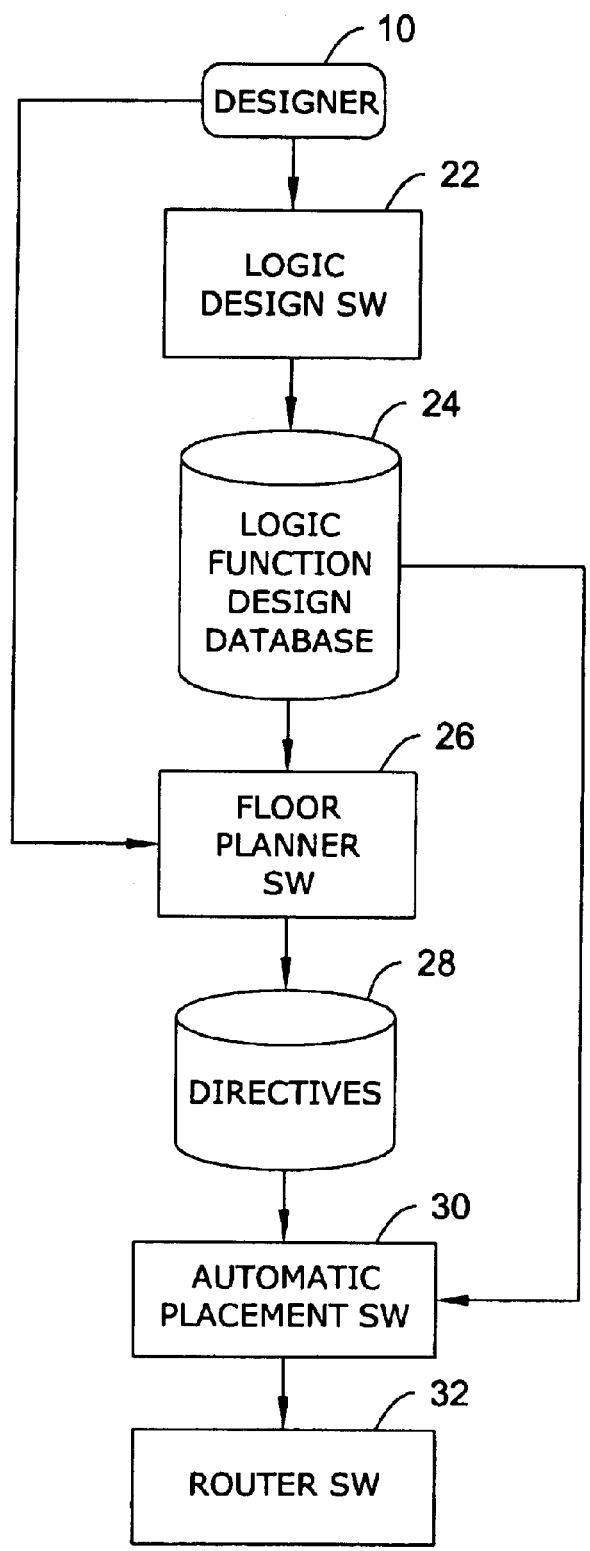
FIG. 2 is a block diagram of an illustrative process environment of the present invention.

FIG. 2 is a block diagram of an illustrative process environment of the present invention. The Designer 10 initially specifies a logic design of an integrated circuit using the graphical user interface (GUI) capabilities of the Logic Design Software (SW) 22 (i.e., when using the schematic method) or inputs a data file containing Hardware Description Language (HDL) text to the Logic Design SW (when using the HDL method). The output of the Logic Design SW 22 is a Logic Function Design Database 24. This database holds the design information, captured by the Logic Design SW 22, describing the logic functions of the circuit being designed by the Designer 10. This database is stored in the Memory 20 of the CAD System 12.

The Logic Function Design Database 24 is input to the Floor Planner SW 26. The Floor Planner SW 26 is a manual placement computer program used to place the logic function blocks and cells onto the integrated circuit chip. The Designer 10 interacts with the Floor Planner SW 26 to direct the placement of the logic blocks and cells. The output of the Floor Planner SW 26 is a set of Directives 28. Directives consist of commands and associated information to direct the Automatic Placement SW 30 to complete the placement of all logic functions and cells that are yet to be placed after the Designer has finished manually placing logic functions and cells. Directives 28 are also stored in the Memory 20 of the CAD System 12. Automatic Placement SW also takes the Logic Function Design Database as an input parameter. The Automatic Placement SW 30 then forwards the completed placement to the Router SW 32 for determination of the routing for the chip.

In the preferred embodiment, the present invention exists as improvements to Floor Planning SW 26 to provide the Designer 10 with the capability to efficiently select, place and align selected cells when desired. This may be particularly beneficial when working with a data path of a circuit design.

Figure 3:
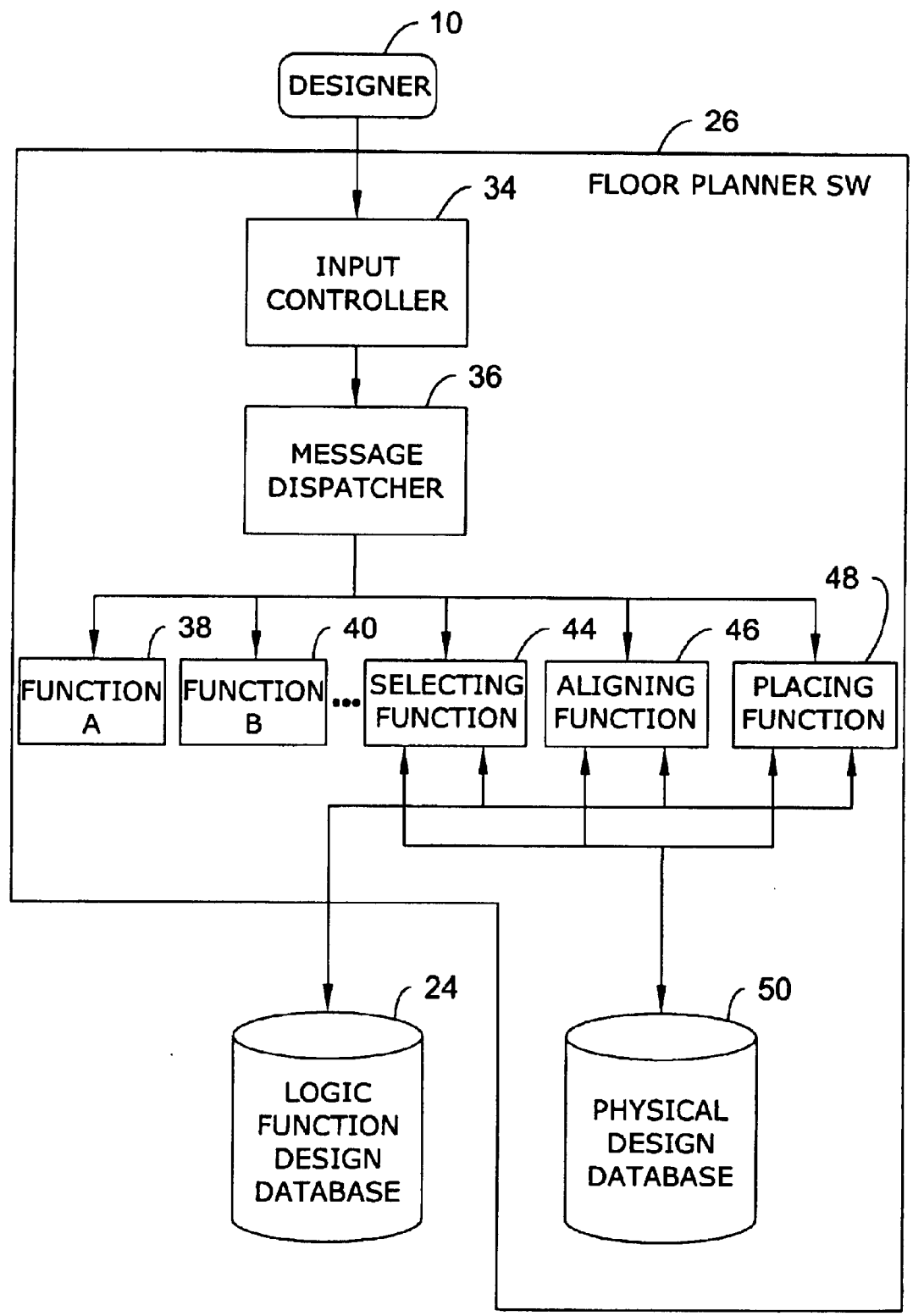
FIG. 3 is a block diagram of the Floor Planner software containing the preferred embodiment of the present invention.

FIG. 3 is a block diagram of the Floor Planner software containing an illustrative embodiment of the present invention. The Designer 10 interacts with the Floor Planner SW 26 to place logic functions specified in the Logic Function Design Database 24 onto an ASIC chip. The Designer uses an input device such as a mouse to make selections from menus containing requests for particular functions to be executed. The Designer may also select portions of the logic function hierarchy to be placed and locations on the ASIC chip where the selected logic functions are to be placed.

The Input Controller 34 handles all input requests from the Designer. Input requests are translated into messages requesting the execution of functions supported by the Floor Planner SW. These messages are forwarded by the Message Dispatcher 36 to various Floor Planner SW functions as required. Sample Floor Planner SW functions are represented on FIG. 3 as Function A 38, Function B 40, etc. When a function receives a message, it is activated to implement the request contained in the message. This implementation sometimes involves an update to the representation of placement processing shown on the Display 18 (not shown in FIG. 3).

Some of the many functions supported by the Floor Planner SW may include a selecting function 44, an aligning function 46 and a placing function 48. The selecting function 44 allows the Designer 10 to select a particular net of the circuit design, and then identify and/or select selected cells that are connected to the net, as further described below. The aligning function 46 allows the Designer 10 to automatically align selected cells along a predetermined axis. The placing function 48 allows selected cells to be placed upon selection. The processing steps of the present invention are embodied in the selecting function 44, the aligning function 46 and the placing function 48. These functions may read from the Logic Function Design Database 24 to identify certain logical connections between cells, and may also read and write the Physical Design Database 50. The Physical Design Database 50 is a data structure holding all placed and unplaced logic functions that are specified by the Logic Function Design Database 24, as well as the interconnections of the same. It is contemplated that the Logic Function Design Database 24 and the Physical Design Database 50 may be incorporated in the same database.

Figure 4:
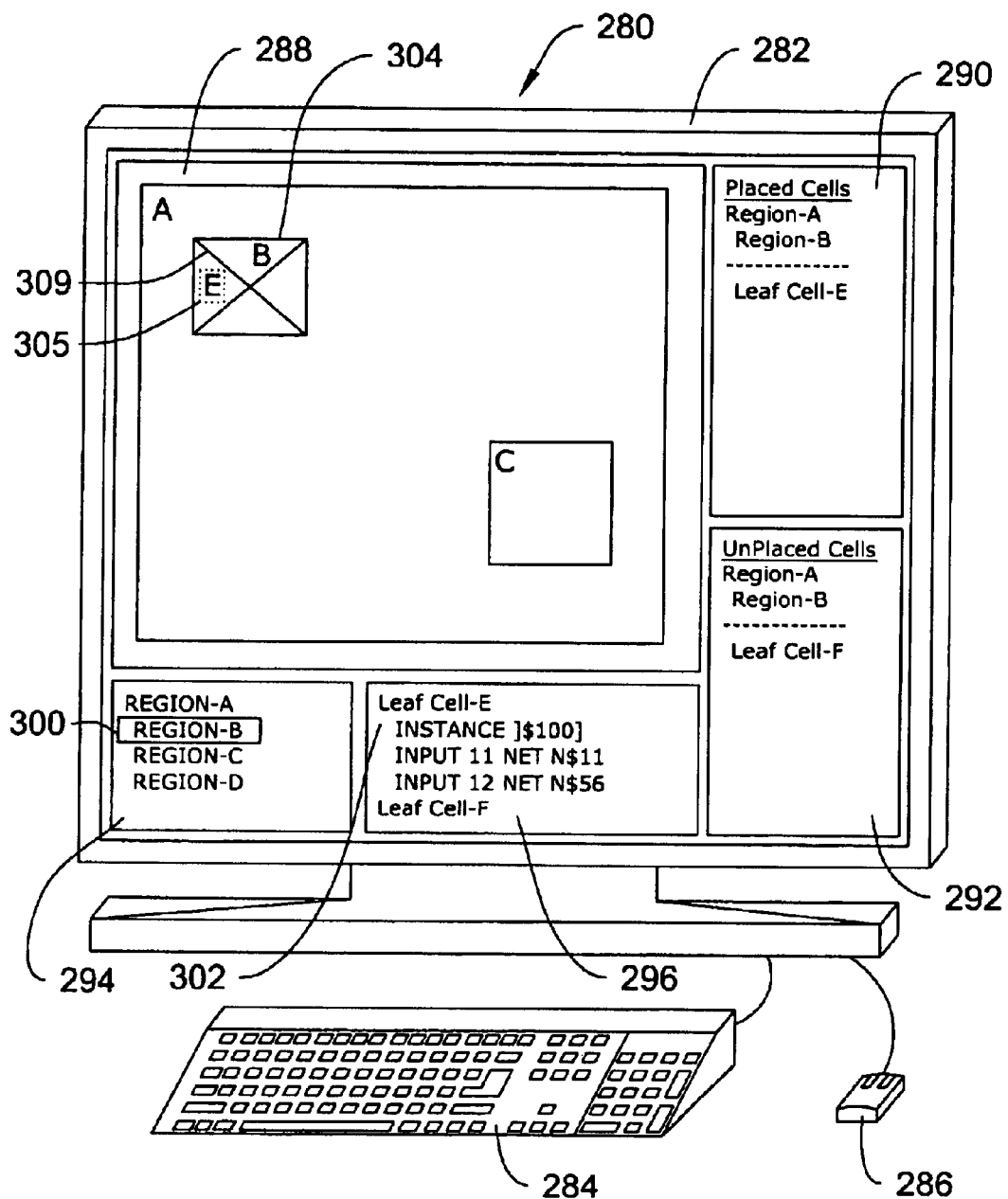
FIG. 4 is a block diagram of a data processing system executing an illustrative placement tool in accordance with the present invention.

FIG. 4 is a block diagram of a data processing system executing an illustrative placement tool in accordance with the present invention. The data processing system 280 include a display device 282, a keyboard 284 and a pointing device 286. A microprocessor or the like may be included in the display device 282 or in a separate unit (not shown). The data processing system 280 preferably incorporates a placement tool. The placement tool may be implemented in either hardware or software. In a preferred embodiment, the placement tool is implemented in software that executes on the data processing system 280.

The illustrative placement tool displays a number of windows on the display device 282. These windows including a floorplanning window 288, two logical windows 294 and 296, and two physical windows 290 and 292. The floorplanning window displays a physical representation of the circuit design database, and in particular, displays those cells and/or logic functions that are placed on a scaled representation of an integrated circuit die.

The first logical window 294 displays a tree graph of the circuit design hierarchy. During use, the circuit designer may scroll through the first logical window 294 to identify particular logic functions (a.k.a. regions) therefrom. In the illustrative diagram, region-B has been identified, as shown at 300. In a preferred embodiment, only logic functions are displayed in the first logical window 294. Leaf cells are not displayed.

The second logical window 296 displays the leaf cells within the logic function that is identified in the first logical window 294. For example, if region-B is identified in the first logic window 294 as shown at 300, the second logical window 296 displays the leaf a cells within region-B. In the example shown, the second logical window 296 displays leaf cell-E and leaf cell-F, as shown at 302.

It is contemplated that the second logical, window 296 may also display selected database objects for each of the leaf cells displayed therein. For example, the second logical window 296 may display the instance name, the input pin names along with the associated net names for each input pin, the output pin names along with the associated net names for each output pin name, etc. It is contemplated that any number of predefined database objects may be displayed for each of the leaf cells within the second logical window 296.

Preferably, the placement tool may allow the circuit designer to set a current context. In general, after any cell or logic function is selected or identified, the circuit designer may set the current context to the selected cell or logic function by hitting a predefined set context key. A further discussing of setting a current context can be found in U.S. patent application Ser. No. 08,7898,026, filed Jan. 27, 1997, and entitled "Method and Apparatus for Selecting Components within a Circuit Design Database", which is incorporated herein by reference.

The first physical window 292 displays all unplaced cells within the current context. Similarly, the second physical window 290 displays all placed cells within the current context. In a preferred embodiment, the current name of the logic function or cell that is set as the current context is displayed in the title bar of each of the first and second physical windows. In the illustrative embodiment, region-B is set as the current context, and thus the title bar above the first and second physical windows displays the name "region-B", as shown.

The floorplanning window 288 displays a number of placed cells. In the present example, region-A, region-B, region-C, and leaf cell-E are displayed. As indicated above, region-B is selected as the current context. Thus, the second logical window 296 displays the cells therein, including leaf cell-E 302 and leaf cell-F (partially shown), and selected database objects therefor: Leaf cell-E 306 is displayed in the second physical window 290, as shown, because leaf cell-E is already placed as shown at 305. Leaf cell-F, on the other hand, is displayed in the first physical window 292, because leaf cell-F remains unplaced.

During placement of a circuit design database, the circuit designer typically scrolls through the first physical window 292 and selects an unplaced region or cell from the first physical window 292. The placement tool may then load a physical representation of the selected region or cell, and the circuit designer may place the physical representation of the region or cell in the floorplanning window 288. The placement tool then moves the region or cell from the first physical window 292 to the second physical window 290. The first and second logic windows 294 and 296 are updated when the selection is changed in either the floorplanning window 288, the first physical window 292 or the second physical window 290.

It is recognized that the circuit design database may be much more complex and contain many more levels of hierarchy than that shown in the simple example of FIG. 4. In a typical circuit design database, large contexts often contain thousands of regions and/or cells, and thus the first and second physical windows typically display many more objects.

As indicated above, data paths have become a greater part of many modern chip designs, often consuming over 80 percent of the total circuitry on the chip. Ideally, a placed data path includes a collection of vertical and horizontal wires with logic elements located at the intersections that combine to perform an overall data processing function. To manually place cells within a data path, it is often desirable to select those cells that are connected to a net or group of nets. For example, it is often desirable to select those cells that are connected to a vectored net, such as a vectored net that crosses the interface of a particular logic function (e g., ALU) within the circuit design. The vectored net may correspond to the output or an intermediate net within the data path. Once selected, it would be desirable to align the cells that are connected to the net to form an optimum data path stage.

To date, selecting cells that are connected to a net or group of nets has been difficult. For example, to select cells that are connected to a particular net, the circuit designer must typically manually find each instance name by scanning some external printout, panning through a list of instance names or net names in the logical or physical windows, or by identifying the physical representation of the cell in the floorplanning window. All of these have proven to be time consuming and tedious, particularly since many logic design synthesis software programs assign computer generated component and net names. Accordingly, circuit designers often only have time to manually place a fraction of the cells within a data path. The remaining cells are typically placed using automatic placement tools, which often use algorithms that optimize wire congestion rather than performance or gate density.

To help overcome these difficulties, the present invention provides methods and apparatus for efficiently identifying, selecting and aligning cells that are associated with a net or group of nets within a circuit design In one illustrative embodiment, a particular net or group of nets is first selected. Then, selected leaf cells that are connected to the selected net or group of nets are automatically identified and selected. This is preferably accomplished by scanning the netlist of the circuit design database, and identifying those cells that are connected to the selected net or group of nets. If desired, the selected leaf cells may then be aligned in a direction of a predetermined alignment axis. This method allows a circuit designer to easily identify, select and align those cells that are connected to a selected net or group of nets within the circuit design. This may be particularly useful when manually placing data paths within a circuit design to improve the performance and gate density of the placement solution.

Figure 5:
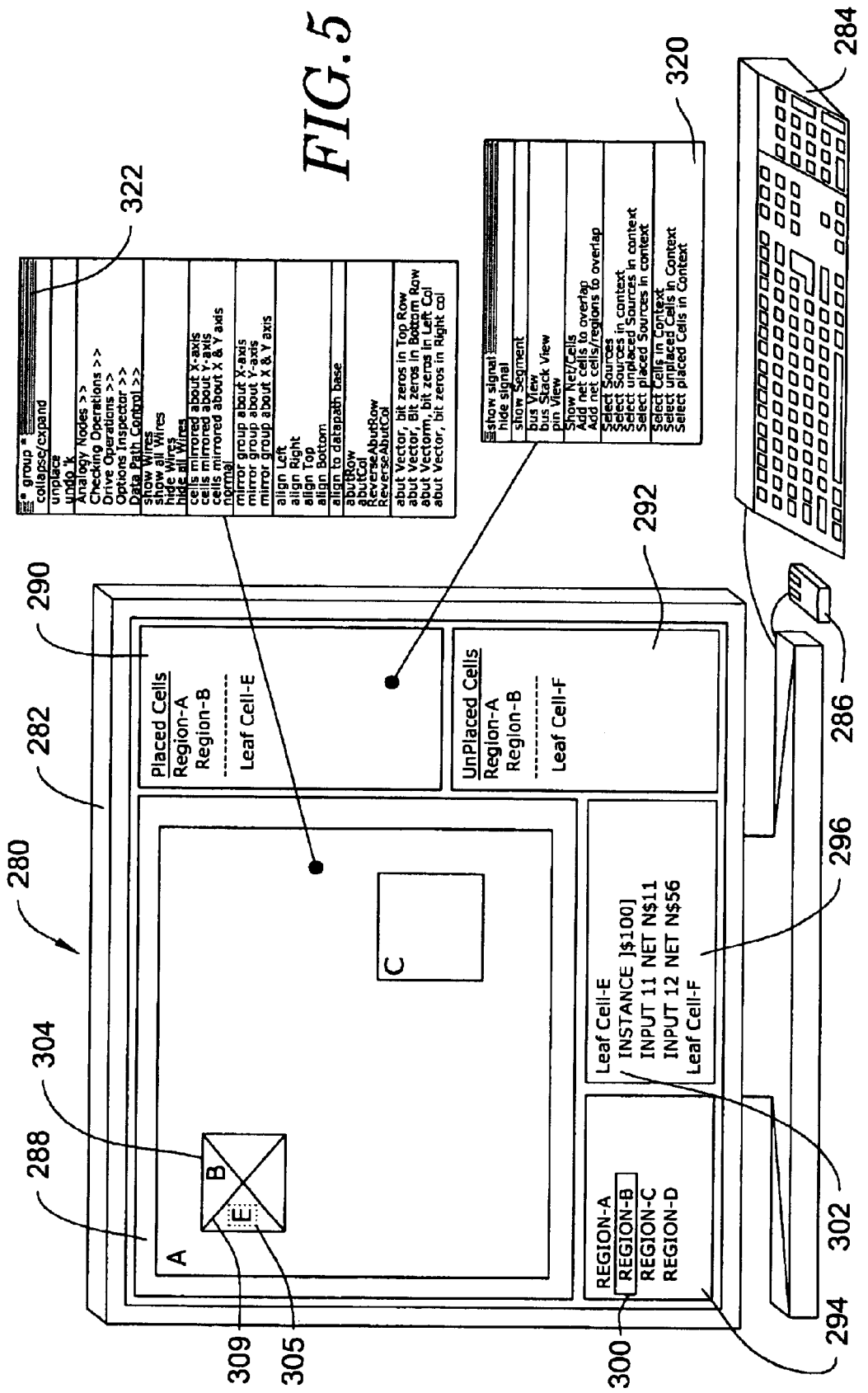
FIG. 5 is a block diagram of the illustrative placement tool of FIG. 4 with the second physical window in an interface mode in accordance with the present invention;.

In one embodiment, the circuit designer may, for example, set the second physical window 290 into an interface mode. In the interface mode, the second physical window 290 displays the nets that cross the interface of the selected region or leaf cell. Thus, to identify a selected net or group of nets, the circuit designer may first select one or more regions or leaf cells, as described above. In FIG. 5, leaf cell-E is selected. Thus, the second physical window 290 may display the nets I1 and I2, which as shown in the second logical window 296, cross the interface of leaf cell-E 302. The circuit designer may then select one or more of the nets shown in the second physical window 290, such as net I1 and/or I2.

Once selected, menu 320 may be used to, for example, select sources, select sources in context, select unplaced sources in context, select placed sources in context, select cells (source and destination) in context, select unplaced cells in context, and select placed cells in context. Menu 320 may be thought of as a qualification or filter when selecting leaf cells that are connected to the selected net or group of nets.

The "select sources" menu option selects the source cells for the selected net or group of nets. The "source" cells are those that have an output connected to the net or group of nets. The "select sources in context" menu option selects the source cells of the selected net or group of nets that are in the same context, and places unplaced source cells in the lower left corner of the hierarchy's region. Both the previously placed and newly placed source cells (that are in the same context of the selected net or group of nets) are selected.

The "select unplaced sources in context" menu option places the unplaced source cells of the selected net or group of nets that are in the same context in the lower left corner of the hierarchy's region. The newly placed cells are then preferably selected.

The "select placed sources in context" menu option selects the placed source cells of the selected net or group of nets that are in the same context. The "select cells in context" menu option selects all cells (source or destination) connected to the selected net or group of nets that are in the same context of the selected nets, and places unplaced cells in the lower left corner of the hierarchy's region. Both the previously placed and newly placed cells (that are in the same context of the selected net) are selected.

The "select unplaced cells in context" menu option places the unplaced cells that are connected to the selected net or group of nets and are in the same context of the selected nets in the lower left corner of the hierarchy's region. The newly placed cells are then selected.

Finally, the "select placed cells in context" menu option selects the placed cells that are connected to the selected net or group of nets that are in the same context. Other selection options are also contemplated, some of which are described below. These various selection options may be used in any combination to provide the circuit designer with great flexibility in identifying and selecting cells within a circuit design.

Often, the net names at the interface of each logic function (non-leaf cell) retain a descriptive value, even after the logic synthesis and logic optimization steps described above. Accordingly, it is often convenient to identify nets at the interface of a logic function and trace the nets backward (or forward) to identify the source leaf cells, the destination leaf cells or both. This provides the circuit designer with a convenient way to trace through a circuit design, such as through a data path of a circuit design.

Using this technique, a circuit designer may identify a vectored net at the interface of a logic function. Once the vectored net is identified and selected, the circuit designer may choose to instruct the placement tool to select all source leaf cells associated with the vectored net, as described above. That is, the circuit designer may direct the placement tool to select all leaf cells that drive the vectored net. Some of these leaf cells may be placed, and others may be unplaced. In a preferred embodiment, the unplaced leaf cells are placed when selected, as further described herein.

Using menu 322 of FIG. 5, the circuit designer may direct the placement tool to align all of the selected leaf cells in a direction of an alignment axis, if desired. In a preferred embodiment, the alignment axis is specified by the circuit designer, and is commonly either substantially horizontal or substantially vertical. In the case of a vectored net, the circuit designer may also specify a predetermined order for the leaf cells. For example, the circuit designer may specify that the source leaf cells should be placed along a substantially horizontal alignment axis with bit zero on the left and bit "N" on the right. Alternatively, the circuit designer may specify that the source leaf cells should be placed along a substantially horizontal alignment axis with bit zero on the right and bit "N" on the left. In another case, the circuit designer may specify that the source leaf cells should be placed along a substantially vertical alignment axis with bit zero on the top and bit "N" on the bottom. Alternatively, the circuit designer may specify that the source leaf cells should be placed along a substantially vertical alignment axis with bit zero on the bottom and bit "N" on the top. In any of these cases, the source leaf cells are aligned in the direction of an alignment axis, with the order of the leaf cells following a particular directive.

More specifically, and referring specifically to FIG. 5, menu 322 includes a number of alignment options including "abut vector with bit zeros in the top row", "abut vector with bit zeros in the bottom row", "abut vector with bit zeros in the left column", and "abut vector with bit zeros in the right column". Abutting cells is similar to aligning cells except the objects are moved so they do not overlap. In some embodiments, a dialog box may ask for a spacing value. The spacing value may determine the spacing between two adjacent objects. A simple alignment command may result in overlapping objects.

The "abut vector with bit zeros in the top row" menu option aligns the source leaf cells along a substantially vertical alignment axis with bit zero on the top and bit "N" on the bottom. Any selected destination leaf cells are placed adjacent the corresponding source leaf cells along an axis that is substantially horizontal.

The "abut vector with bit zeros in the bottom row" menu option aligns the source leaf cells along a substantially vertical alignment axis with bit zero on the bottom and bit "N" on the top. Any selected destination leaf cells are placed adjacent the corresponding source leaf cells along an axis that is substantially horizontal.

The "abut vector with bit zeros in the left column" menu option aligns the source leaf cells along a substantially horizontal alignment axis with bit zero on the left and bit "N" on the right. Any selected destination leaf cells are placed adjacent the corresponding source leaf cells along an axis that is substantially vertical.

Finally, the "abut vector with bit zeros in the right column" menu option aligns the source leaf cells along a substantially horizontal alignment axis with bit zero on the right and bit "N" on the left. Any selected destination leaf cells are placed adjacent the corresponding source leaf cells along an axis that is substantially horizontal.

When more than just the source leaf cells are selected for each net, such as when both the source and destination leaf cells are selected, the placement tool may arrange the selected leaf cells into an array configuration. Typically, each of the identified leaf cells is associated with one of the ordered bits of the vectored net. As such, the source leaf cells of each net may be aligned in the direction of the alignment axis and in a particular order, as described above. The destination leaf cells may then be placed adjacent the corresponding source leaf cells along an axis that is perpendicular to the alignment axis, thereby resulting in an array of leaf cells. It is recognized that the various nets of the vectored net may have a different number of destination leaf cells connected thereto, and thus may have a different number of destination leaf cells lined up adjacent to the corresponding source leaf cell. All of these alignment features may be used alone or in combination to provide the circuit designer with an efficient way to identify, select and align cells within a circuit design database.

Figure 6:
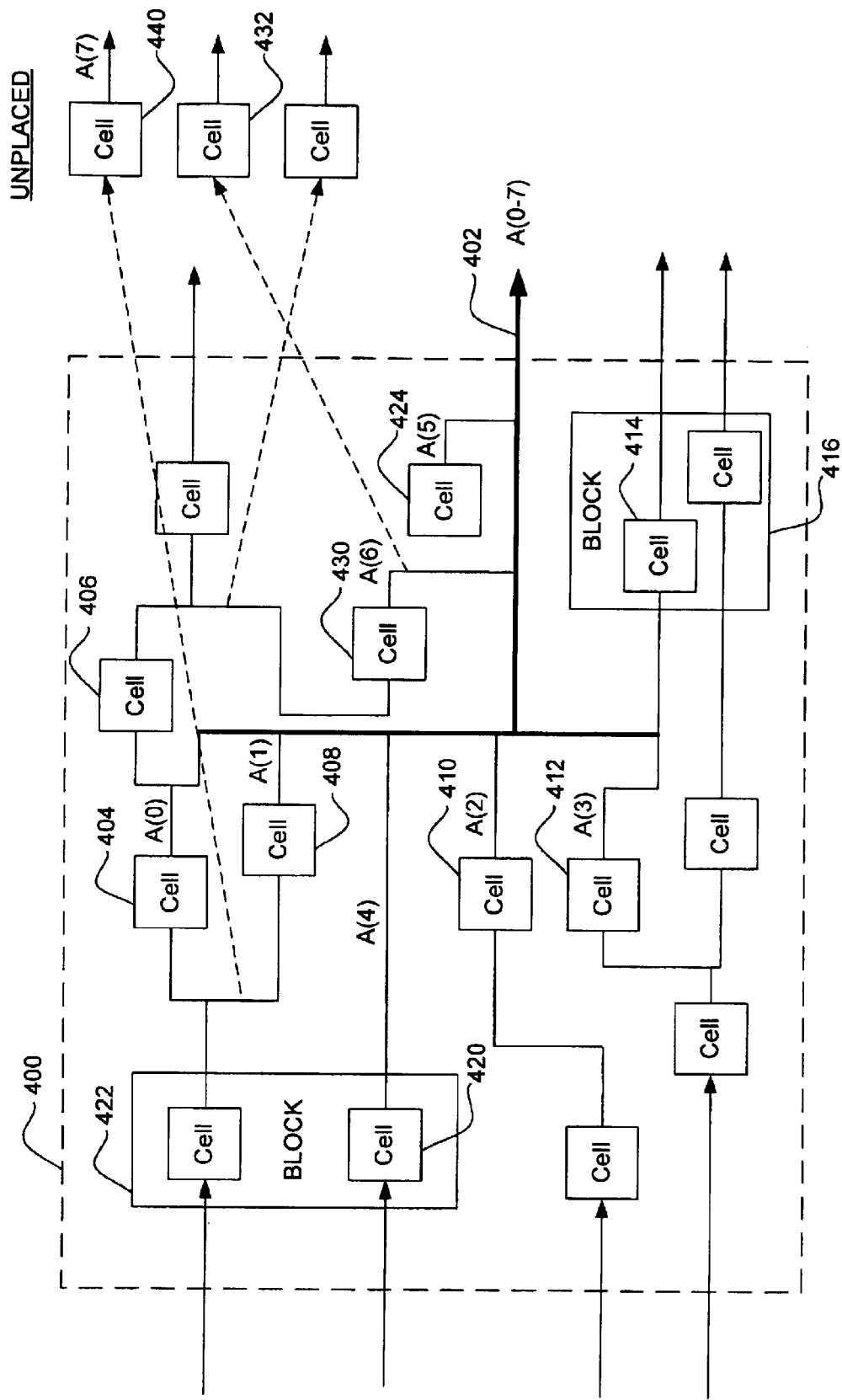
FIG. 6 is a schematic diagram showing an illustrative circuit design with some cells placed and other cells unplaced.

FIG. 6 is a schematic diagram showing an illustrative circuit design with some cells placed and other cells unplaced. The illustrative circuit design may correspond to a logic function, for example, with the regions and cells within dashed line 400 placed, and the regions and cells outside of dashed line 400 unplaced.

A vectored net A(0–7) 402 is shown crossing the boundary 400. Bit "0" of A(0–7) 402 is connected to the output port of source leaf cell 404 and to the input port of destination leaf cell 406. Bit "1" of A(0–7) 402 is connected to the output port of source leaf cell 408. Bit "2" of A(0–7) 402 is connected to the output port of source leaf cell 410. Bit "1" and bit "2" have no destination leaf cells shown.

Bit "3" of A(0–7) 402 is connected to the output port of source leaf cell 412 and to the input port of destination leaf cell 414. Destination leaf cell 414 is at a lower level of hierarchy within the circuit design, since it is part of function block 416.

Bit "4" of A(0–7) 402 is connected to the output port of source leaf cell 420. In this case, source leaf cell 420 is at a lower level of hierarchy in the circuit design, since it is part of function block 422. Bit "5" of A(0–7) 402 is connected to the output port of source leaf cell 424. Like Bit "1" and bit "2" above, bit "4" and bit "5" have no destination leaf cell shown.

Bit "6" of A(0–7) 402 is connected to the output port of source leaf cell 430 and to the input port of destination leaf cell 432. Destination leaf cell 432 is shown as being unplaced. Finally, Bit "7" of A(0–7) 402 is connected to the output port of source leaf cell 440. Source leaf cell 440 is shown as being unplaced. Like bits "1", "2", "4" and "5", above, bit "7" has no destination leaf cell shown.

Figure 7:
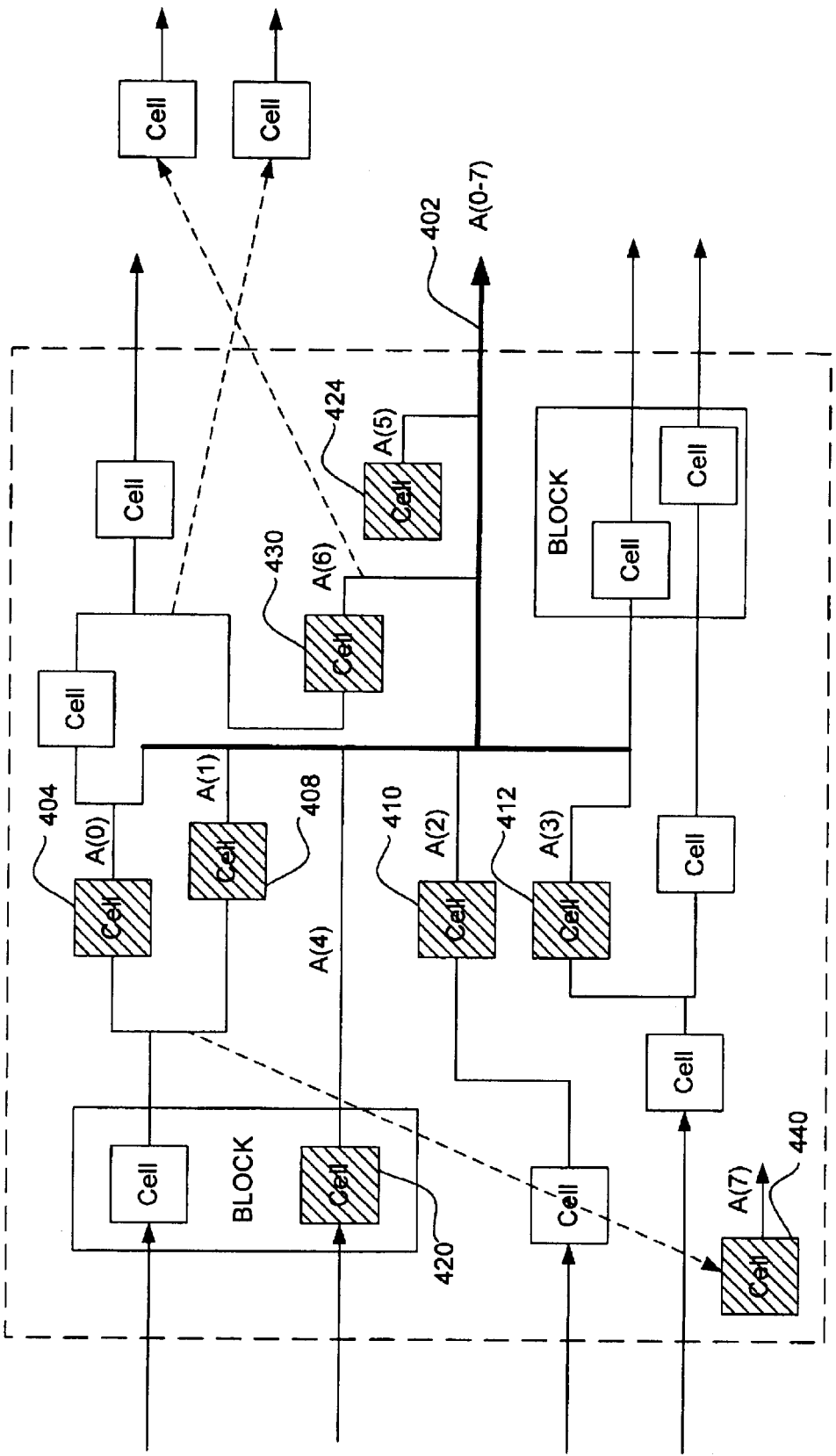
FIG. 7 is a schematic diagram of the illustrative circuit design of FIG. 6, demonstrating the "select sources" menu option described above.

FIG. 7 is a schematic diagram of the illustrative circuit design of FIG. 6, demonstrating the "select sources" menu option described above. The circuit designer first preferably selects a net or group of nets, such as net A(0–7). As indicated above, the net names at the interface of each logic function (non-leaf cell) often retain a descriptive value, even after the logic synthesis and logic optimization steps. Accordingly, it is often convenient for a circuit designer to identify nets at the interface of a logic function, such as logic function 400.

Once the vectored net A(0–7) 402 is identified and selected, the "select sources" menu option selects all source leaf cells that drive one or more bits of the vectored net A(0–7). In the example shown, the "select sources" menu option selects source leaf cells 404, 408, 410, 412, 420, 424, 430 and 440 which drive bits 0 . . . 7 of A(0–7), respectively. Since source leaf cell 440 is initially unplaced, the placement tool preferably places this cell in the lower left corner of the logic function 400 upon selection, as shown.

Figure 8:
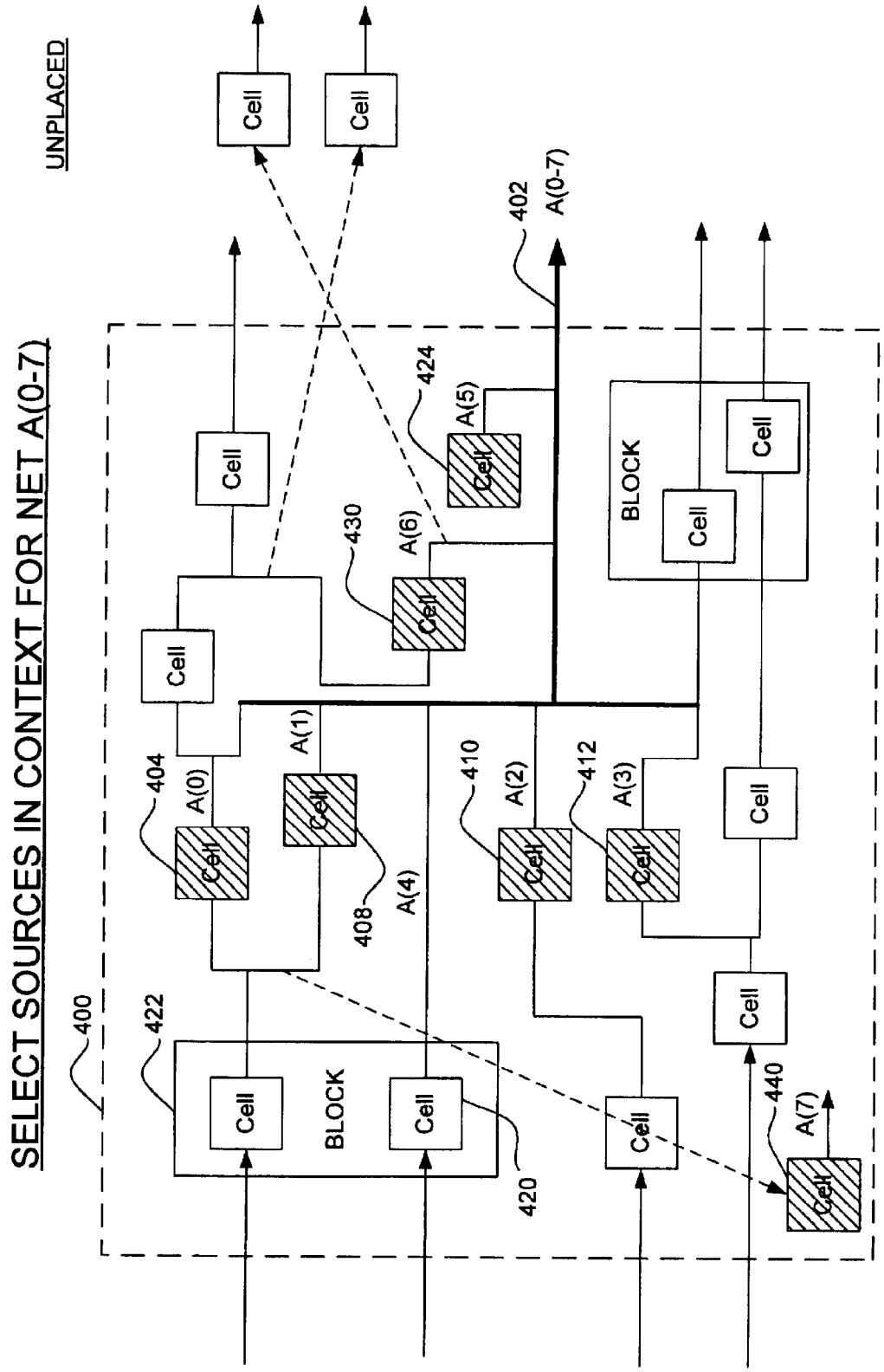
FIG. 8 is a schematic diagram of the illustrative circuit design of FIG. 6, demonstrating the "select sources in context" menu option.

FIG. 8 is a schematic diagram of the illustrative circuit design of FIG. 6, demonstrating the "select sources in context" menu option. In the example shown, the current context is set at logic function 400. Like above, the circuit designer may first select vectored net A(0–7). Once selected, the "select sources in context" menu option selects all source leaf cells that: (1) drive one or more bits of the vectored net A(0–7); and (2) are in the current context. In the example shown, this includes source leaf cells 404, 408, 410, 412, 424, 430 and 440. Again, since source leaf cell 440 is initially unplaced, the placement tool may place source leaf cell 440 in the lower left corner of the logic function 400 upon selection, as shown.

Source leaf cell 420 is not selected because it is not placed in the current context. As indicated above, the current context is set at logic function 400. When the context is set, all of the objects existing at the next lower level in the circuit design hierarchy are available for placement or editing. These objects are called children objects of the current context, and may include other hierarchical objects, including regions and/or cells. Thus, a context may include a mixture of regions and cells. Source leaf cell 420 is part of logic block 422, and thus is two levels of hierarchy below logic function 400. Accordingly, source leaf cell 420 is not selected in response to the "select sources in context" menu option.

Figure 9:
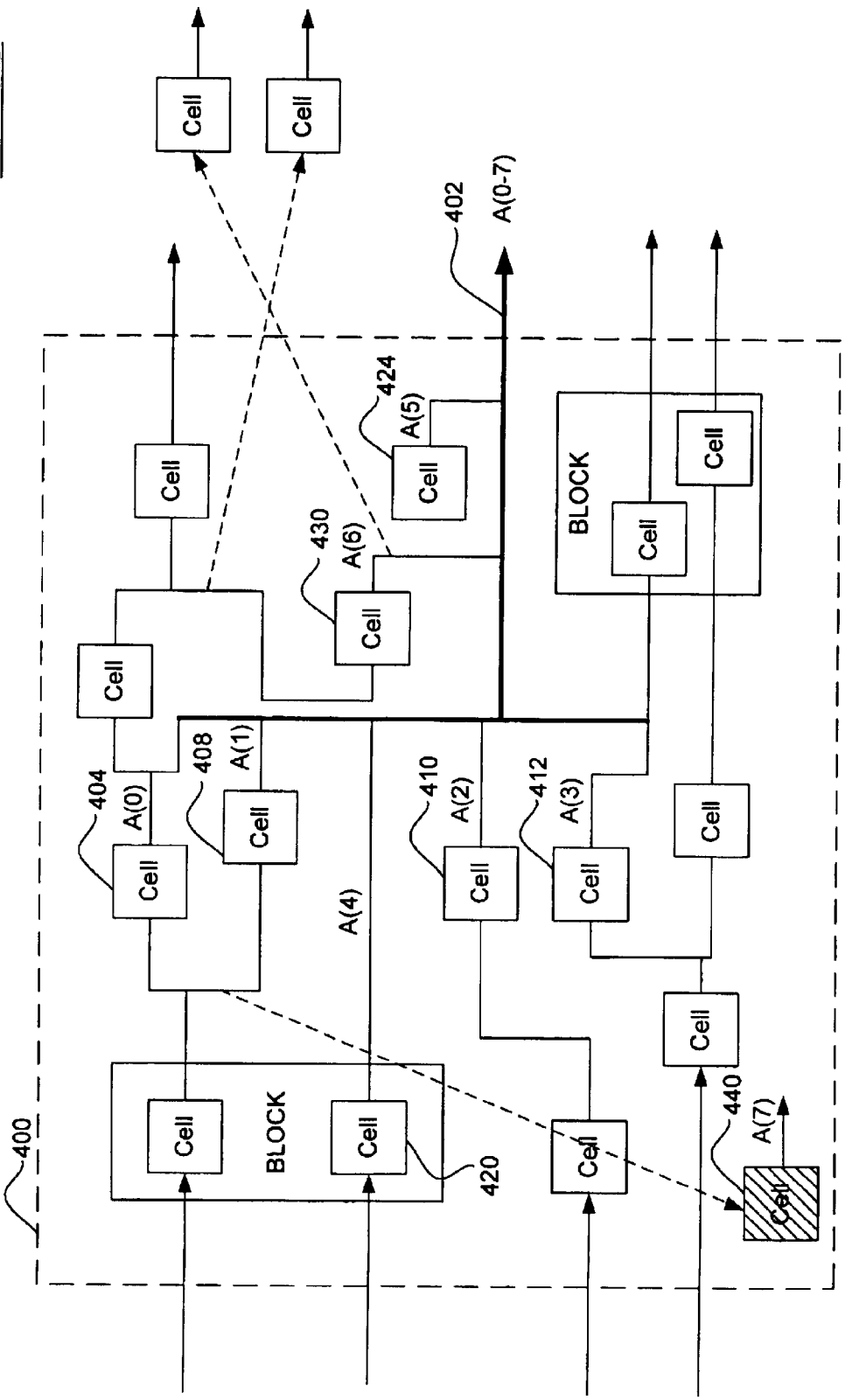
FIG. 9 is a schematic diagram of the illustrative circuit design of FIG. 6, demonstrating the "select unplaced sources in context" menu option.

FIG. 9 is a schematic diagram of the illustrative circuit design of FIG. 6, demonstrating the "select unplaced sources in context" menu option. Again, the current context is set at logic function 400. Like above, the circuit designer may first select vectored net A(0–7). Once selected, the "select unplaced sources in context" menu option selects all source leaf cells that: (1) drive one or more bits of the vectored net A(0–7); (2) are in the current context; and (3) are unplaced. In the example shown, this only includes source leaf cell 440. Source leaf cells 404, 408, 410, 412, 424, and 430 are not selected because they are already placed. Source leaf cell 420 is not selected because it is not part of the current context and it is already placed. Again, since source leaf cell 440 is initially unplaced, the placement tool may place source leaf cell 440 in the lower left corner of the logic function 400 upon selection, as shown.

Figure 10:
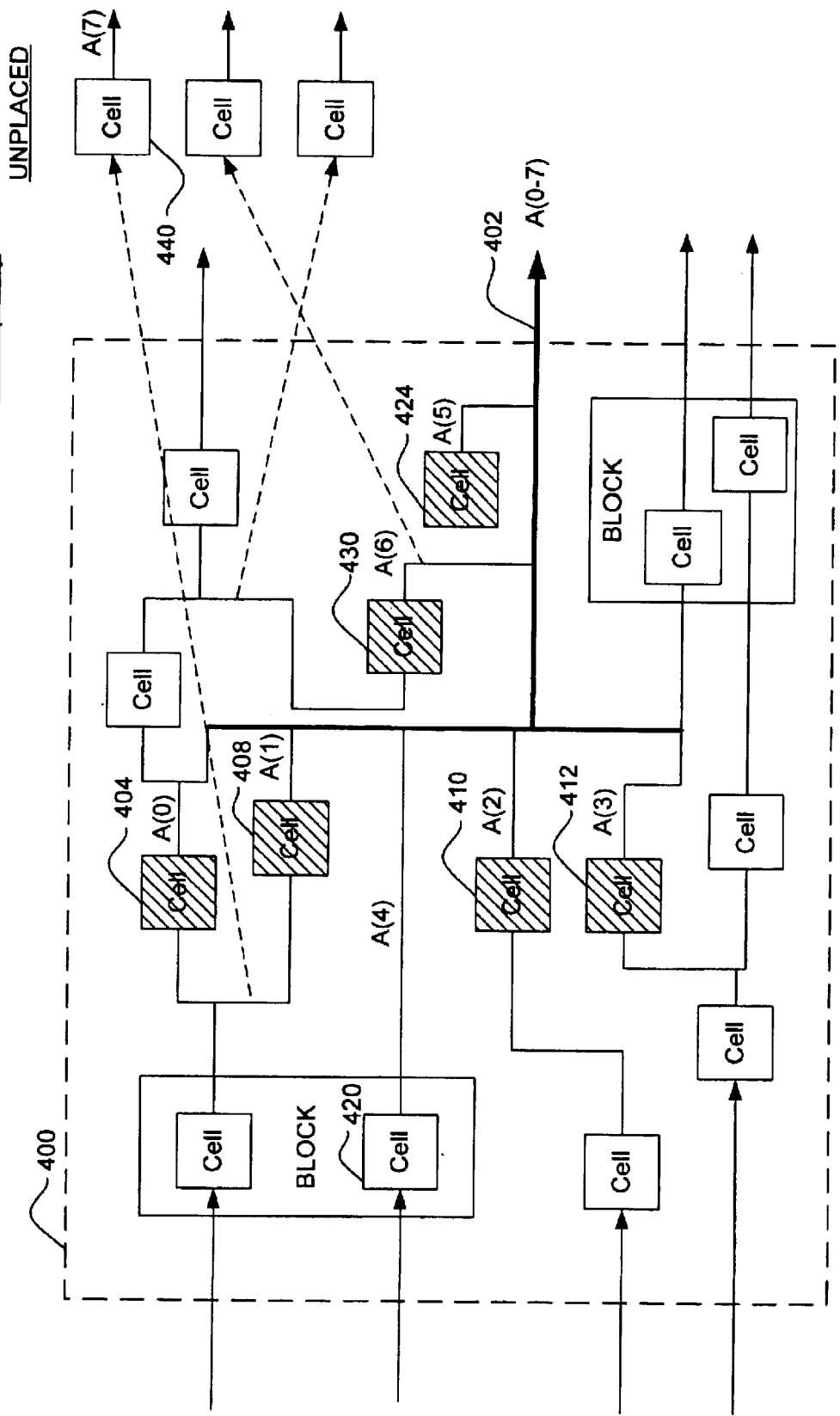
FIG. 10 is a schematic diagram of the illustrative circuit design of FIG. 6, demonstrating the "select placed sources in context" menu option.

FIG. 10 is a schematic diagram of the illustrative circuit design of FIG. 6, demonstrating the "select placed sources in context" menu option. Again, the current context is set at logic function 400. Like above, the circuit designer may first select vectored net A(0–7). Once selected, the "select placed sources in context" menu option selects all source leaf cells that: (1) drive one or more bits of the vectored net A(0–7); (2) are in the current context; and (3) are placed. In the example shown, this includes source leaf cells 404, 408, 410, 412, 424, and 430. Source leaf cell 440 is not selected because it is unplaced. Source leaf cell 420 is not selected because it is not part of the current context.

Figure 11:
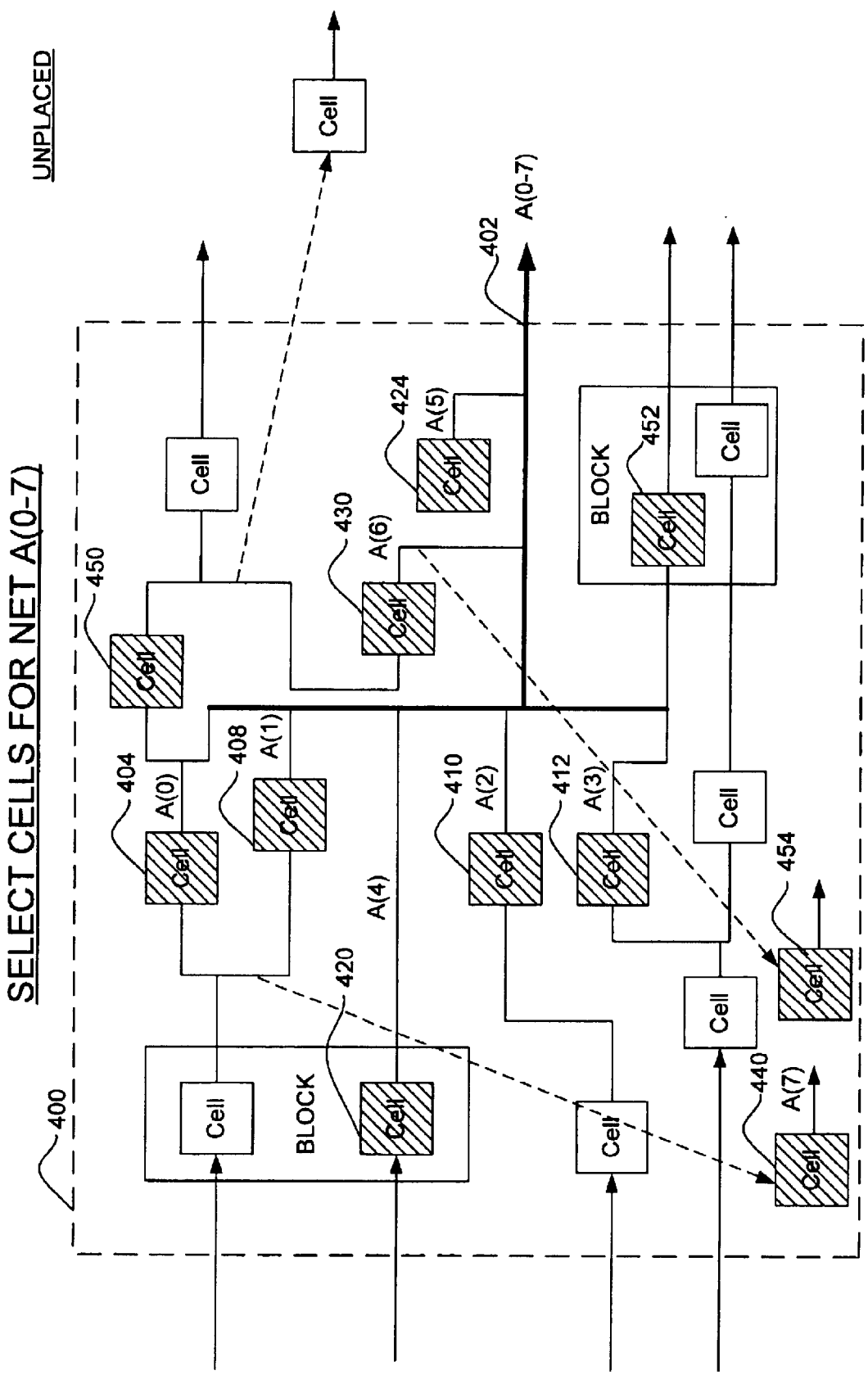
FIG. 11 is a schematic diagram of the illustrative circuit design of FIG. 6, demonstrating the "select cells" menu option.

FIG. 11 is a schematic diagram of the illustrative circuit design of FIG. 6, demonstrating the "select cells" menu option. The "select cells" menu option selects all leaf cells including source and destination leaf cells, that are connected to the selected net or group of nets. Accordingly, once vectored net A(0–7) 402 is selected, the "select cells" menu option selects all source and destination leaf cells connected to vectored net A(0–7) 402. In the example shown, this includes source leaf cells 404, 408, 410, 412, 420 424, 430 and 440, and destination leaf cells 450, 452 and 454. Since source leaf cell 440 and destination leaf cell 454 are initially unplaced, the placement tool may place them in the lower left corner of the logic function 400 upon selection, as shown.

Figure 12:
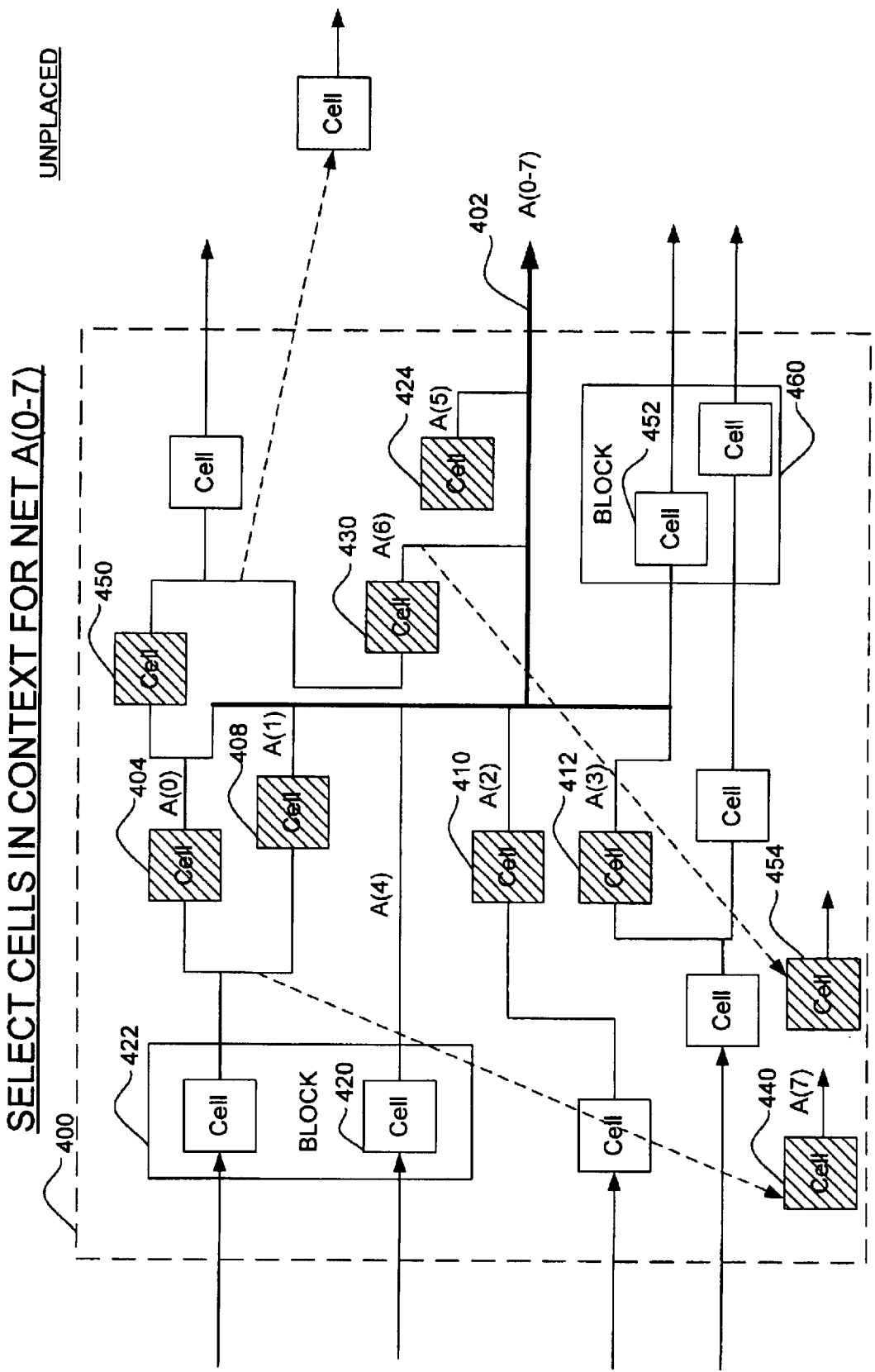
FIG. 12 is a schematic diagram of the illustrative circuit design of FIG. 6, demonstrating the "select cells in context" menu option.

FIG. 12 is a schematic diagram of the illustrative circuit design of FIG. 6, demonstrating the "select cells in context" menu option. Like above, the current context is set at logic function 400. Accordingly, once vectored net A(0–7) 402 is selected, the "select cells in context" menu option selects all source and destination leaf cells that: (1) are connected to vectored net A(0–7) 402; and (2) are in the current context. In the example shown, this includes source leaf cells 404, 408, 410, 412, 424, 430 and 440, and destination leaf cells 450 and 454. Source leaf cell 420 and destination leaf cell 452 are not selected because they are not in the current context. Source leaf cell 420 is part of function block 422, and destination leaf cell 452 is part of function block 460, and thus neither are in the current context. Since source leaf cell 440 and destination leaf cell 454 are initially unplaced, the placement tool may place them in the lower left corner of the logic function 400 upon selection, as shown.

Figure 13:
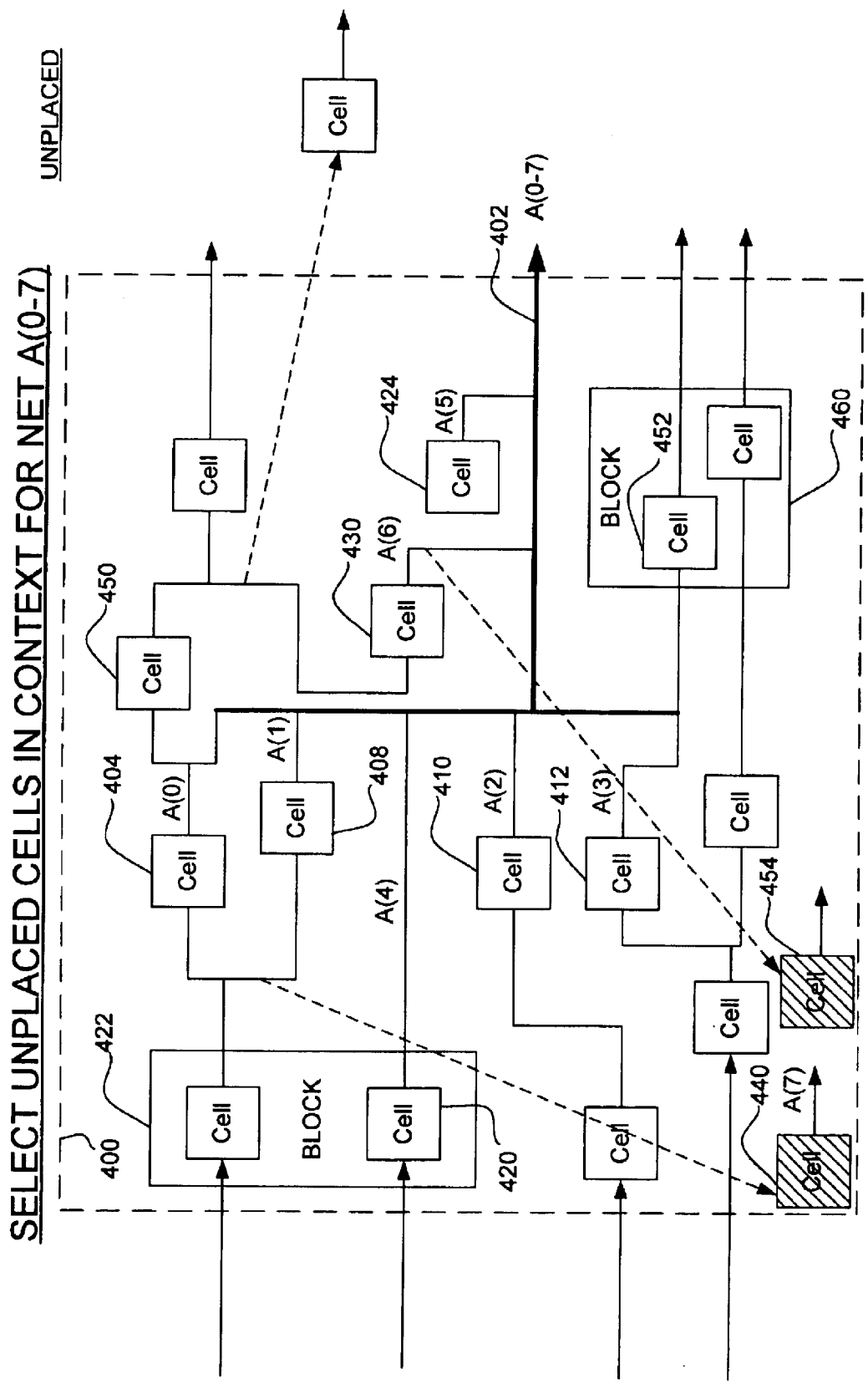
FIG. 13 is a schematic diagram of the illustrative circuit design of FIG. 6, demonstrating the "select unplaced cells in context" menu option.

FIG. 13 is a schematic diagram of the illustrative circuit design of FIG. 6, demonstrating the "select unplaced cells in context" menu option. Like above, the current context is set at logic function 400. Once vectored net A(0–7) 402 is selected, the "select unplaced cells in context" menu option selects all source and destination leaf cells that: (1) are connected to vectored net A(0–7) 402; (2) are in the current context; and (3) are unplaced. In the example shown, this includes source leaf cell 440 and destination leaf cell 454. Source leaf cells 404, 408, 410, 412, 424, and 430, and destination leaf cell 450 are not selected because they are already placed. Source leaf cell 420 and destination leaf cell 452 are not selected because they are both not in the current context and already placed. Since source leaf cell 440 and destination leaf cell 454 are initially unplaced, the placement tool may place them in the lower left corner of the logic function 400 upon selection, as shown.

Figure 14:
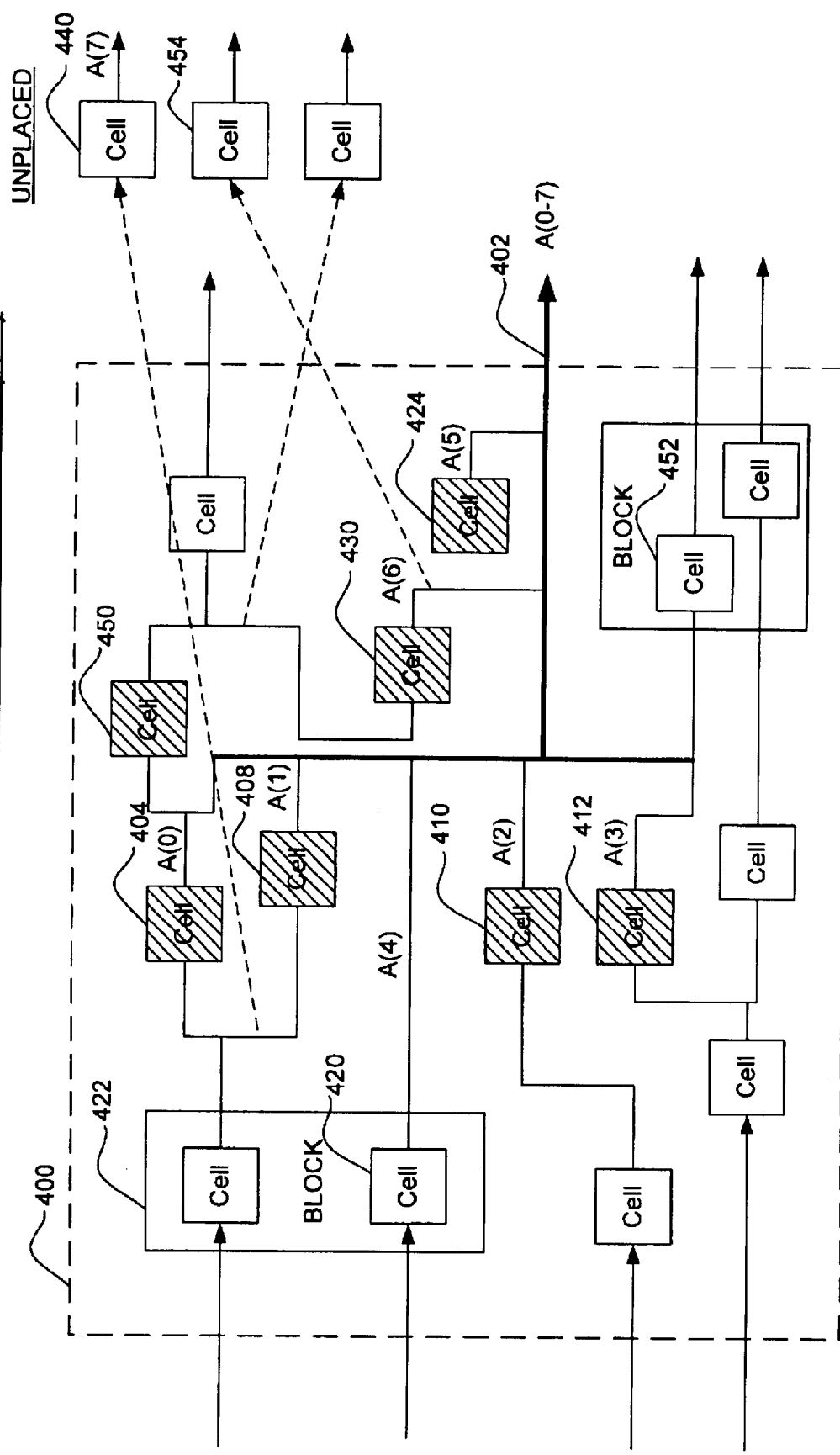
FIG. 14 is a schematic diagram of the illustrative circuit design of FIG. 6, demonstrating the "select placed cells in context" menu option.

FIG. 14 is a schematic diagram of the illustrative circuit design of FIG. 6, demonstrating the "select placed cells in context" menu option. Like above, the current context is set at logic function 400. Once vectored net A(0–7) 402 is selected, the "select placed cells in context" menu option selects all source and destination leaf cells that: (1) are connected to vectored net A(0–7) 402; (2) are in the current context; and (3) are placed In the example shown, this includes source leaf cells 404, 408, 410, 412, 424, and 430, and destination leaf cell 450. Destination leaf cells 440 and 454 are not selected because they are not placed. Source leaf cell 420 and destination leaf cell 452 are not selected because they are not in the current context.

It is contemplated that numerous other selection criteria can be used in accordance with the present invention. One such example is to select only destination leaf cells that are connected to the selected net or group of nets. All destination leaf cells may be selected, or alternatively, only those destination leaf cells that are placed, unplaced, in the current context, and/or meet some other criteria. In any event, the present invention may be used to select certain cells in a circuit design database that are connected to a selected net or group of nets.

Figure 15:
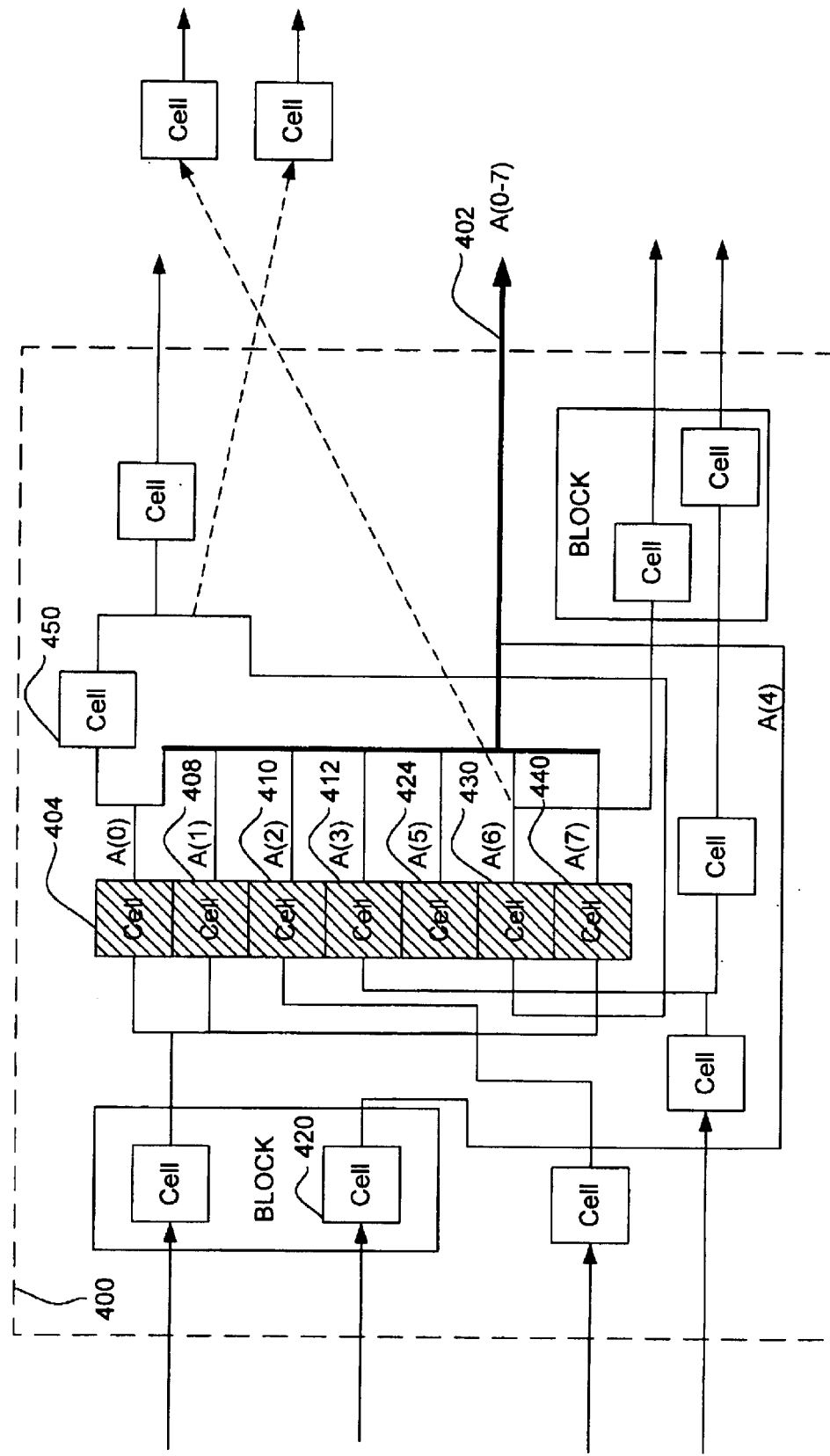
FIG. 15 is a schematic diagram of the illustrative circuit design of FIG. 6, demonstrating the "select sources in context" menu option, followed by the "abut vector with zeros in the top row" menu option.

FIG. 15 is a schematic diagram of the illustrative circuit design of FIG. 6, demonstrating the "select sources in context" menu option, followed by the "abut vector with zeros in the top row" menu option. In the example shown, the current context is set at logic function 400. Once the vectored net A(0–7) 402 is selected, the "select sources in context" menu option selects all source leaf cells that: (1) drive one or more bits of the vectored net A(0–7); and (2) are in the current context. In the example shown, this includes source leaf cells 404, 408, 410, 412, 424, 430 and 440. Source leaf cell 420 is not selected because it is not in the current context. Since source leaf cell 440 is initially unplaced, the placement tool may place source leaf cell 440 in the lower left corner of the logic function 400 upon selection, as shown.

Once selected, the "abut vector with zeros in the top row" menu option may align source leaf cells 404, 408, 410, 412, 424, 430 and 440, with source leaf cell 404 in the top row and source leaf cell 440 in the bottom row. Source leaf cell 404 drives bit zero of vectored net A(0–7) 402, and source leaf cell 440 drives bit seven. In the example shown, source leaf cells 404, 408, 410, 412, 424, 430 and 440 are abutted along an alignment axis that is substantially vertical. In some embodiments, a dialog box may ask for a spacing value for determining the spacing between two adjacent objects. In FIG. 15, the spacing between the leaf cells is set to zero.

Figure 16:
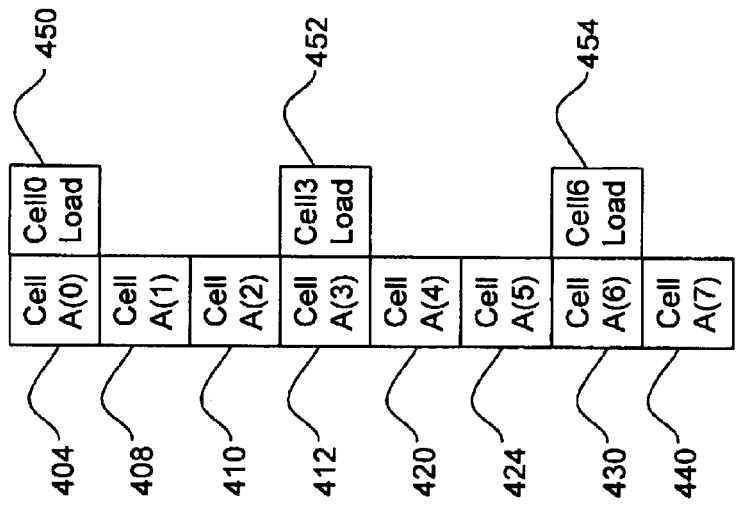
FIG. 16 is a diagram demonstrating the "select cells" menu option, followed by the "abut vector with zeros in the top row" menu option.

FIG. 16 is a diagram demonstrating the "select cells" menu option, followed by the "abut vector with zeros in the top row" menu option. As indicated above with reference to FIG. 11, the "select cells" menu option selects all leaf cells, including source and destination leaf cells, that are connected to the selected net or group of nets. Accordingly, and with reference to FIG. 11, once vectored net A(0–7) 402 is selected, the "select cells" menu option selects all source and destination leaf cells connected to vectored net A(0–7) 402. In the example shown, this includes source leaf cells 404, 408, 410, 412, 420 424, 430 and 440, and destination leaf cells 450, 452 and 454.

Once selected, the "abut vector with zeros in the top row" menu option may align source leaf cells 404, 408, 410, 412, 420, 424, 430 and 440, with source leaf cell 404 in the top row and source leaf cell 440 in the bottom row. Source leaf cell 404 drives bit zero of vectored net A(0–7) 402, and source leaf cell 440 drives bit seven. In the example shown, source leaf cells 404, 408, 410, 412, 420, 424, 430 and 440 are abutted along an alignment axis that is substantially vertical. In some embodiments, a dialog box may ask for a spacing value for determining the spacing between two adjacent objects. In FIG. 16, the spacing between the leaf cells is set to zero.

Because more than just the source leaf cells are selected, the selected leaf cells may be arranged into an array configuration. Each of the identified leaf cells is associated with one of the ordered bits of the vectored net A(0–7) 402. As such, the source leaf cells 404, 408, 410, 412, 420, 424, 430 and 440 may be aligned along an alignment axis that is substantially vertical, as shown. The destination leaf cells 450, 452 and 454 may then be placed adjacent the corresponding source leaf cell along an axis that is perpendicular to the vertical alignment axis, thereby resulting in an array of leaf cells.

In the example shown, destination leaf cell 450 is coupled to bit zero of vectored net A(0–7) 402. Thus, destination leaf cell 450 is placed adjacent and to the right of source leaf cell 404, which drives bit zero of the vectored net A(0–7) 402. Likewise, destination leaf cell 452 is coupled to bit three of the vectored net A(0–7) 402. Thus, destination leaf cell 452 is placed adjacent and to the right of source leaf cell 412, which drives bit three of the vectored net A(0–7) 402. Finally, destination leaf cell 454 is coupled to bit six of the vectored net A(0–7) 402. Thus, destination leaf cell 454 is placed adjacent and to the right of source leaf cell 430, which drives bit six of the vectored net A(0–7) 402.

Figure 17:
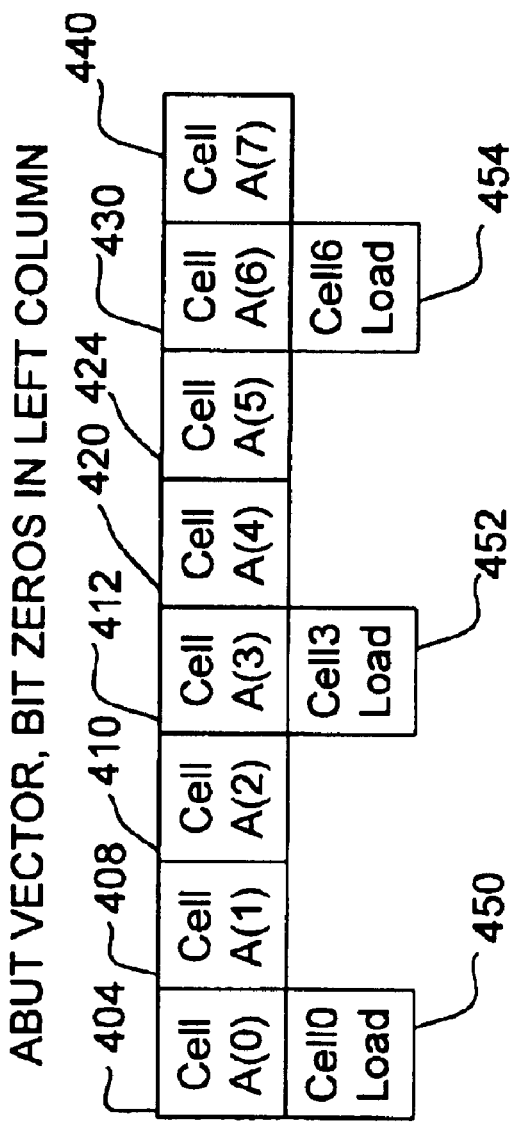
FIG. 17 is a diagram demonstrating the "select cells" menu option, followed by the "abut vector with zeros in the left column" menu option.

FIG. 17 is a diagram demonstrating the "select cells" menu option, followed by the "abut vector with zeros in the left column" menu option. As indicated above with reference to FIG. 11, the "select cells" menu option selects all leaf cells, including source and destination leaf cells, that are connected the selected net or group of nets. Accordingly, and with reference to FIG. 11, once vectored net A(0–7) 402 is selected, the "select cells" menu option selects all source and destination leaf cells connected to vectored net A(0–7) 402. In the example shown, this includes source leaf cells 404, 408, 410, 412, 420 424, 430 and 440, and destination leaf cells 450, 452 and 454.

Once selected, the "abut vector with zeros in the left column" menu option may align source leaf cells 404, 408, 410, 412, 420, 424, 430 and 440, with source leaf cell 404 in the left column and source leaf cell 440 in the right column. Source leaf cell 404 drives bit zero of vectored net A(0–7) 402, and source leaf cell 440 drives bit seven. In the example shown, source leaf cells 404, 408, 410, 412, 420, 424, 430 and 440 are aligned along an alignment axis that is substantially horizontal. In some embodiments, a dialog box may ask for a spacing value for determining the spacing between two adjacent objects. In FIG. 17, the spacing between the leaf cells is set to zero.

Because more than just the source leaf cells are selected, the selected leaf cells may be arranged into an array configuration. Each of the identified leaf cells is associated with one of the ordered bits of the vectored net A(0–7) 402. As such, the source leaf cells 404, 408, 410, 412, 420, 424, 430 and 440 may be aligned along an alignment axis that is substantially horizontal as shown. The destination leaf cells 450, 452 and 454 may then be placed adjacent the corresponding source leaf cell along an axis that is perpendicular to the horizontal alignment axis, thereby resulting in an array of leaf cells.

In the example shown, destination leaf cell 450 is coupled to bit zero of vectored net A(0–7) 402. Thus, destination leaf cell 450 is placed adjacent and below source leaf cell 404, which drives bit zero of the vectored net A(0–7) 402. Likewise, destination leaf cell 452 is coupled to bit three of the vectored net A(0–7) 402. Thus, destination leaf cell 452 is placed adjacent and below source leaf cell 412, which drives bit three of the vectored net A(0–7) 402. Finally, destination leaf cell 454 is coupled to bit six of the vectored net A(0–7) 402. Thus, destination leaf cell 454 is placed adjacent and below source leaf cell 430, which drives bit six of the vectored net A(0–7) 402.

Figure 18:
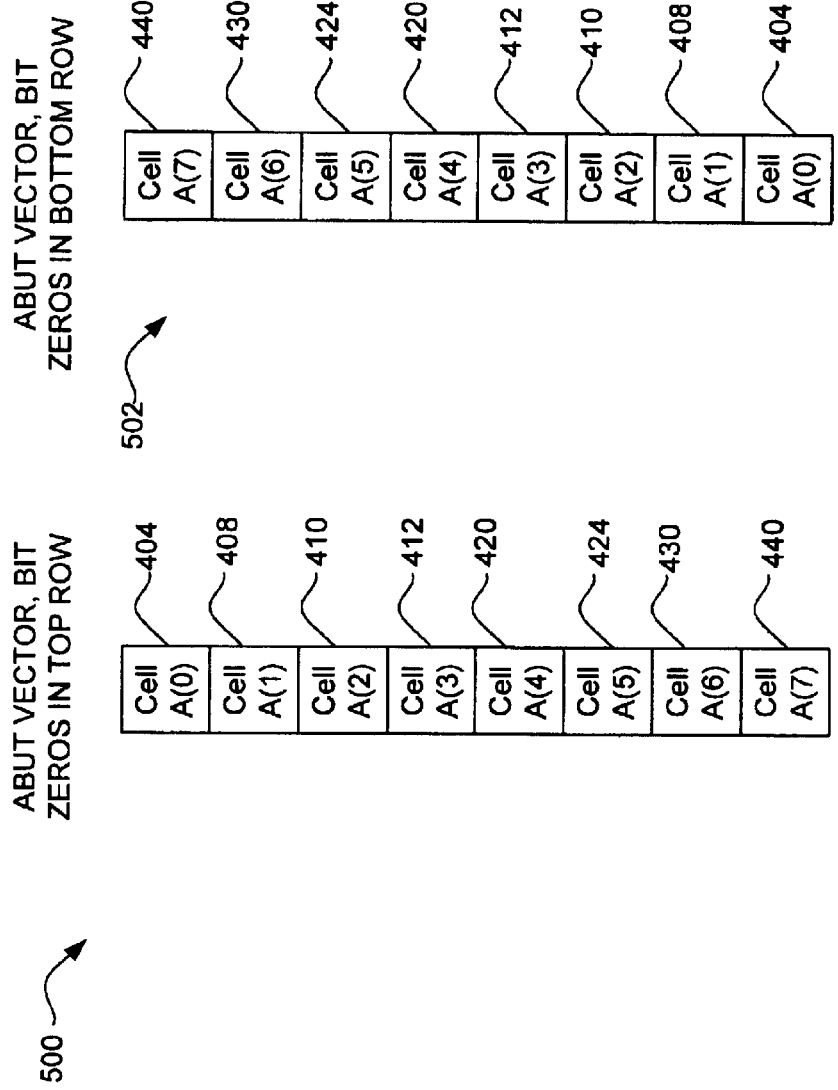
FIG. 18 is a diagram demonstrating the "select sources" menu option, followed by the "abut vector with zeros in the top row" menu option and the "abut vector with zeros in the bottom row" menu option.

FIG. 18 is a diagram demonstrating the "select sources" menu option, followed by the "abut vector with zeros in the top row" menu option and the "abut vector with zeros in the bottom row" menu option. As indicated above with reference to FIG. 7, the "select sources" menu option selects all source leaf cells that drive the selected net or group of nets. Accordingly, and with reference to FIG. 7, once vectored net A(0–7) 402 is selected, the "select sources" menu option selects source leaf cells: 404, 408, 410, 412, 420 424, 430 and 440.

Once selected, and as generally shown at 500, the "abut vector with zeros in the top row" menu option may align source leaf cells 404, 408, 410, 412, 420, 424, 430 and 440, with source leaf cell 404 in the top row and source leaf cell 440 in the bottom row. Source leaf cell 404 drives bit zero of vectored net A(0–7) 402, and source leaf cell 440 drives bit seven. Source leaf cells 404, 408, 410, 412, 420, 424, 430 and 440 are aligned along an alignment axis that is substantially vertical.

Alternatively, and as generally shown at 502, the "abut vector with zeros in the bottom row" menu option may align source leaf cells 404, 408, 410, 412, 420, 424, 430 and 440, with source leaf cell 404 in the bottom row and source leaf cell 440 in the top row. Source leaf cell 404 drives bit zero of vectored net A(0–7) 402, and source leaf cell 440 drives bit seven. Source leaf cells 404, 408, 410, 412, 420, 424, 430 and 440 are again aligned along an alignment axis that is substantially vertical.

FIG. 19 is a diagram demonstrating the "select sources" menu option, followed by the "abut vector with zeros in the left column" menu option and the "abut vector with zeros in the right column" menu option. As indicated above with reference to FIG. 7, the "select sources" menu option selects all source leaf cells that drive the selected net or group of nets. Accordingly, and with reference to FIG. 7, once vectored net A(0–7) 402 is selected, the "select sources" menu option selects source leaf cells 404, 408, 410, 412, 420 424, 430 and 44.

Once selected, and as generally shown at 510, the "abut vector with zeros in the left column" menu option may align source leaf cells 404, 408, 410, 412, 420, 424, 430 and 440, with source leaf cell 404 in the left column and source leaf cell 440 in the right column. Source leaf cell 404 drives bit zero of vectored net A(0–7) 402, and source leaf cell 440 drives bit seven. Source leaf cells 404, 408, 410, 412, 420, 424, 430 and 440 are aligned along an alignment axis that is substantially horizontal.

Alternatively, and as generally shown at 512, the "abut vector with zeros in the right column" menu option may align source leaf cells 404, 408, 410, 412, 420, 424, 430 and 440, with source leaf cell 404 in the right column and source leaf cell 440 in the left column. Source leaf cell 404 drives bit zero of vectored net A(0–7) 402, and source leaf cell 440 drives bit seven. Source leaf cells 404, 408, 410, 412, 420, 424, 430 and 440 are again aligned along an alignment axis that is substantially horizontal.

Having thus described the preferred embodiments of the present invention, those of skill in the art will readily appreciate that the teachings found herein may be applied to yet other embodiments within the scope of the claims hereto attached.

What is claimed is:

1. A computerized method for selecting cells in a circuit design database, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the computerized method comprising the steps of:

selecting one of the nets via a user input device;

identifying selected leaf cells that are connected to the selected net, wherein the selected leaf cells identified by the identifying step include only the source leaf cell that is connected to the selected net; and selecting the identified leaf cells.

2. A method according to claim 1, wherein the selected leaf cells identified by the identifying step include all of the leaf cells that are connected to the selected net.

3. A method according to claim 1, wherein each of the leaf cells in the circuit design database is either placed or unplaced, the identifying step only identifying those leaf cells that are connected to the selected net and are placed.

4. A method according to claim 1, wherein each of the leaf cells in the circuit design database is either placed or unplaced, the identifying step only identifying those leaf cells that are connected to the selected net and are unplaced.

5. A method according to claim 1, wherein two or more of the nets are selected, and the identifying step identifies selected leaf cells that are connected to any of the selected nets.

6. A method according to claim 5, wherein the identifying step identifies only those leaf cells that are placed.

7. A method according to claim 5, wherein the identifying step identifies only those leaf cells that are unplaced.

8. A method according to claim 5, wherein the identifying step identifies only those leaf cells that are in a current context.

9. A method according to claim 5, wherein the identifying step identifies only those leaf cells that are source leaf cells for the selected nets.

10. A method according to claim 5, wherein the identifying step identifies only those leaf cells that are destination leaf cells for the selected nets.

11. A computerized method for selecting cells in a circuit design database, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the computerized method comprising the steps of:

selecting one of the nets via a user input device;

identifying selected leaf cells that are connected to the selected net;

selecting the identified leaf cells; and setting a current context.

12. A method according to claim 11, wherein the selected leaf cells identified by the identifying step include only those leaf cells that are connected to the selected net and are in the current context.

13. A method according to clam 11, wherein the selected leaf cells identified by the identifying step include only the source leaf cell that is connected to the selected net and is in the current context.

14. A method according to claim 11, wherein the selected leaf cells identified by the identifying step include only the destination leaf cells that are connected to the selected net and are in the current context.

15. A method according to claim 11, wherein each of the leaf cells in the circuit design database is either placed or unplaced, the identifying step only identifying those leaf cells that are connected to the selected net, are placed, and are in the current context.

16. A method according to claim 15, wherein the identifying step only identifies the source leaf cell that is connected to the selected net, is placed, and is in the current context, if any.

17. A method according to claim 15, wherein the identifying step only identifies the source leaf cell that is connected to the selected net, is unplaced, and is in the current context, if any.

18. A method according to claim 11, wherein each of the leaf cells in the circuit design database is either placed or unplaced, the identifying step only identifying those leaf cells that are connected to the selected net, are unplaced, and are in the current context.

19. A computerized method for selecting cells in a circuit design database, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the computerized method comprising the steps of:

selecting two or more of the nets via a user input device, wherein the two or more nets are part of a vectored net;

identifying selected leaf cells that are connected to any of the selected nets; and selecting the identified leaf cells.

20. A method according to claim 19, wherein the vectored net is selected at an interface of a selected logic function.

21. A computerized method for selecting and aligning cells in a circuit design database using a placement tool, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the computerized method comprising the steps of:

selecting one or more of the nets via a user input device;

identifying and selecting selected leaf cells that are connected to the selected one or more nets, wherein the selected leaf cells identified by the identifying step include only the source leaf cell(s) that are connected to the one or more selected nets;

identifying an alignment axis; and aligning selected ones of the identified leaf cells in the direction of the alignment axis.

22. A method according to claim 21, wherein the alignment axis is substantially horizontal.

23. A method according to claim 21, wherein the alignment axis is substantially vertical.

24. A method according to claim 21, wherein each of the leaf cells in the circuit design database is either placed or unplaced, the aligning step further including the step of placing the identified leaf cells if not already placed.

25. A method according to claim 24, wherein the unplaced identified leaf cells are first placed in a predetermined region before alignment.

26. A method according to claim 21, wherein the aligning step puts the selected identified leaf cells into a predetermined order along the alignment axis.

27. A computerized method for selecting and aligning cells in a circuit design database using a placement tool, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the computerized method comprising the steps of:

selecting one or more of the nets via a user input device, wherein the one or more nets are part of a vectored net having ordered bits;

identifying and selecting selected leaf cells that are connected to the selected one or more nets;

identifying an alignment axis; and aligning selected ones of the identified leaf cells in the direction of the alignment axis, wherein the aligning step Ruts the selected identified leaf cells into a predetermined order alone the alignment axis.

28. A method according to claim 27, wherein the aligning step orders the selected identified leaf cells in accordance with the ordered bits of the vectored net.

29. A method according to claim 27, wherein the aligning step orders the selected identified leaf cells in reverse of the ordered bits of the vectored net.

30. A method according to claim 27, wherein each of the identified leaf cells is associated with one of the ordered bits of the vectored net, and the identified leaf cells for each ordered bit has one source leaf cell and at least one destination leaf cell, the aligning step putting the source leaf cells into a predetermined order along the alignment axis, and putting the at least one destination leaf cell adjacent the corresponding source leaf cell along an axis that is perpendicular to the alignment axis.

31. A data processing system for selecting cells in a circuit design database, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the data processing system comprising:

net selection means for selecting one or more of the nets of the circuit design database;

leaf cell identifying means for identifying selected leaf cells that are connected to the selected net(s), wherein the selected leaf cells identified by the identifying means include only the source leaf cell(s) that is/are connected to the selected net(s); and leaf cell selecting means for selecting the identified leaf cells.

32. A data processing system according to claim 31, further comprising:

identifying means for identifying an alignment axis; and aligning means for aligning the identified leaf cells in the direction of the alignment axis.

33. A computerized method for selecting cells in a circuit design database, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the computerized method comprising the steps of:

selecting one of the nets via a user input device;

identifying selected leaf cells that are connected to the selected net, wherein the selected leaf cells identified by the identifying step only include one or more of the destination leaf cell(s) that is/are connected to the selected net; and selecting the identified leaf cells.

34. A computerized method for selecting and aligning cells in a circuit design database using a placement tool, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the computerized method comprising the steps of:

selecting one or more of the nets via a user input device;

identifying and selecting selected leaf cells that are connected to the selected one or more nets, wherein the selected leaf cells identified by the identifying step only include one or more of the destination leaf cell(s) that is/are connected to the one or more selected net;

identifying an alignment axis; and aligning selected ones of the identified leaf cells in the direction of the alignment axis.

35. A data processing system for selecting cells in a circuit design database, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets for connecting an output port of a source leaf cell to an input port of one or more destination leaf cells, the data processing system comprising:

net selection means for selecting one or more of the nets of the circuit design database;

leaf cell identifying means for identifying selected leaf cells that are connected to the selected net(s), wherein the selected leaf cells identified by the identifying means only include one or more of the destination leaf cell(s) that is/are connected to the one or more selected net(s); and leaf cell selecting means for selecting the identified leaf cells.

\* \* \* \* \*

UNITED STATES PATENT AND TRADEMARK OFFICE
CERTIFICATE OF CORRECTION

PATENT NO. : 6,889,370 B1
DATED : May 3, 2005
INVENTOR(S) : Joseph P. Kerzman and James E. Rezek It is certified that error appears in the above-identified patent and that said Letters Patent is hereby corrected as shown below:

Column 23,
Line 15, "Ruts" should read -- puts --.
Line 16, "alone" should read -- along --.

Signed and Sealed this

Twelfth Day of July, 2005

JON W. DUDAS
*Director of the United States Patent and Trademark Office*